(12) United States Patent
Totoki et al.

(10) Patent No.: US 10,957,705 B2
(45) Date of Patent: Mar. 23, 2021

(54) THREE-DIMENSIONAL MEMORY DEVICES HAVING A MULTI-STACK BONDED STRUCTURE USING A LOGIC DIE AND MULTIPLE THREE-DIMENSIONAL MEMORY DIES AND METHOD OF MAKING THE SAME

(71) Applicant: SANDISK TECHNOLOGIES LLC, Addison, TX (US)

(72) Inventors: Yuji Totoki, Yokkaichi (JP); Shigehisa Inoue, Yokkaichi (JP); Yuki Kasai, Yokkaichi (JP); Hironori Matsuoka, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 56 days.

(21) Appl. No.: 16/231,752

(22) Filed: Dec. 24, 2018

(65) Prior Publication Data
US 2020/0203364 A1 Jun. 25, 2020

(51) Int. Cl.
*H01L 27/11582* (2017.01)
*G11C 5/06* (2006.01)
(Continued)

(52) U.S. Cl.
CPC ........ *H01L 27/11582* (2013.01); *G11C 5/063* (2013.01); *H01L 25/0657* (2013.01);
(Continued)

(58) Field of Classification Search
CPC .................................................. H01L 25/0657
See application file for complete search history.

(56) References Cited

U.S. PATENT DOCUMENTS 5,915,167 A   6/1999  Leedy
9,496,272 B2  11/2016 Cernea
(Continued)

OTHER PUBLICATIONS

Notification of Transmittal of the International Search Report and Written Opinion of the International Search Authority for International Patent Application No. PCT/US2019/049028, dated Dec. 19, 2019, 10 pages.

(Continued)

*Primary Examiner* — Yu-Hsi D Sun
(74) *Attorney, Agent, or Firm* — The Marbury Law Group LLC

(57) ABSTRACT

A first memory die including an array of first memory stack structures and a logic die including a complementary metal oxide semiconductor (CMOS) circuit are bonded. The CMOS circuit includes a first peripheral circuitry electrically coupled to nodes of the array of first memory stack structures through a first subset of first metal interconnect structures included within the first memory die. A second memory die is bonded to the first memory die. The second memory die includes an array of second memory stack structures. The CMOS circuit includes a second peripheral circuitry electrically coupled to nodes of the array of second memory stack structures through a second subset of first metal interconnect structures included within the first memory die and through second metal interconnect structures included within the second memory die. The logic die provides peripheral devices that support operation of memory stack structures in multiple memory dies.

12 Claims, 34 Drawing Sheets

(51) Int. Cl.

| | | |
|---|---|---|
| *H01L 25/065* | (2006.01) | |
| *H01L 27/11519* | (2017.01) | |
| *H01L 27/11573* | (2017.01) | |
| *H01L 27/11556* | (2017.01) | |
| *H01L 27/11529* | (2017.01) | |
| *H01L 27/11565* | (2017.01) | |
| *H01L 27/1157* | (2017.01) | |
| *H01L 27/11524* | (2017.01) | |

(52) U.S. Cl.
CPC .... *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01)

(56) References Cited

U.S. PATENT DOCUMENTS

| | | |
|---|---|---|
| 9,530,790 B1 | 12/2016 | Lu et al. |
| 9,935,050 B2 | 4/2018 | Dunga et al. |
| 10,283,493 B1 | 5/2019 | Nishida |
| 2016/0079164 A1 | 3/2016 | Fukuzumi et al. |
| 2016/0181228 A1 | 6/2016 | Higuchi et al. |
| 2017/0069598 A1 | 3/2017 | Nelson et al. |
| 2017/0294377 A1 | 10/2017 | Dunga et al. |
| 2017/0352678 A1* | 12/2017 | Lu ...................... H01L 21/4846 |

OTHER PUBLICATIONS

U.S. Appl. No. 15/873,101, filed Jan. 17, 2018, SanDisk Technologies LLC.
U.S. Appl. No. 15/892,648, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/213,180, filed Dec. 7, 2018, SanDisk Technologies LLC.
U.S. Appl. No. 16/213,382, filed Dec. 7, 2018, SanDisk Technologies LLC.
Endoh et al., "Novel Ultra High Density Memory with a Stacked-Surrounding Gate Transistor (S-SGT) Structured Cell," IEDM Proc., (2001), 33-36.

* cited by examiner

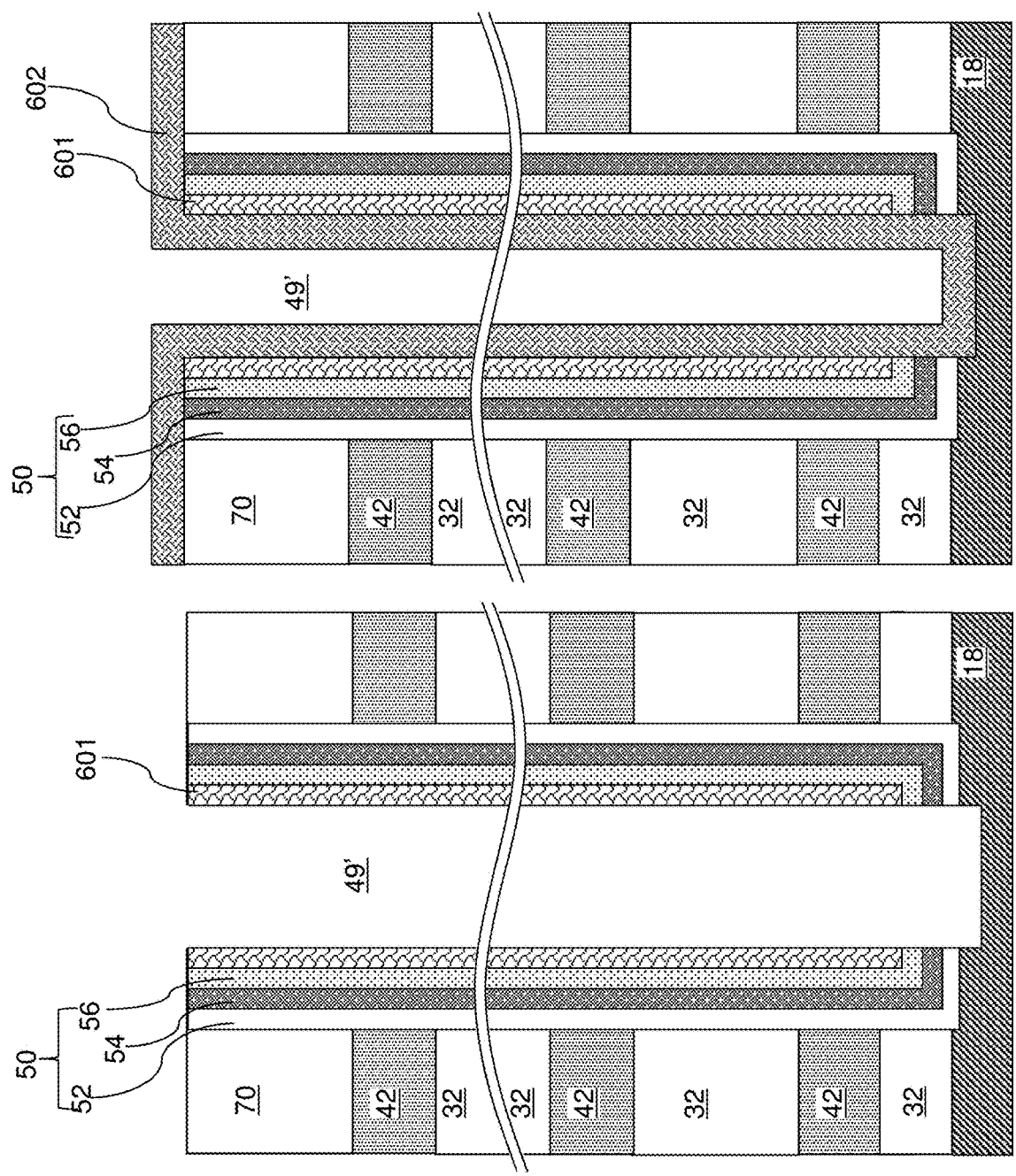

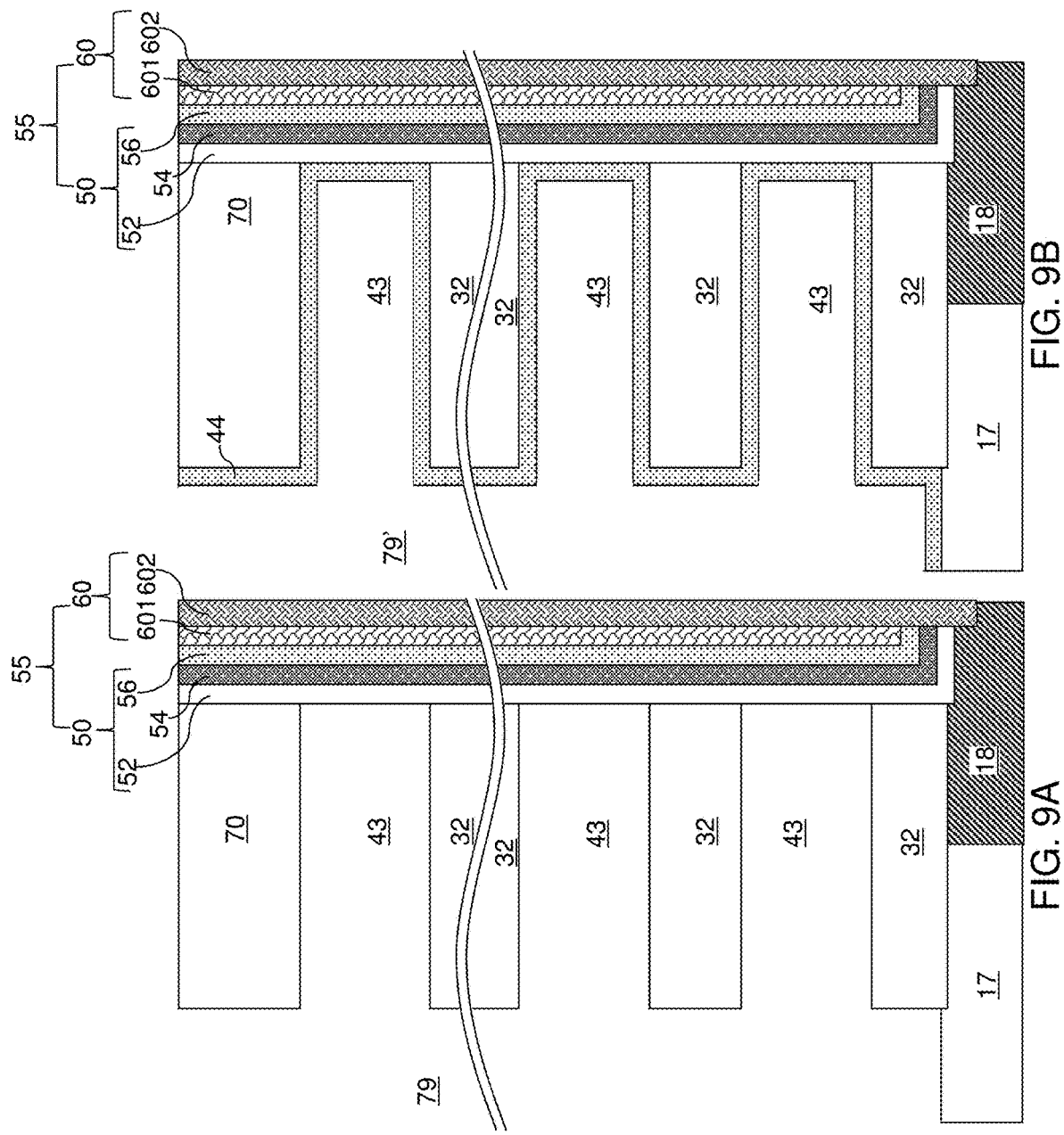

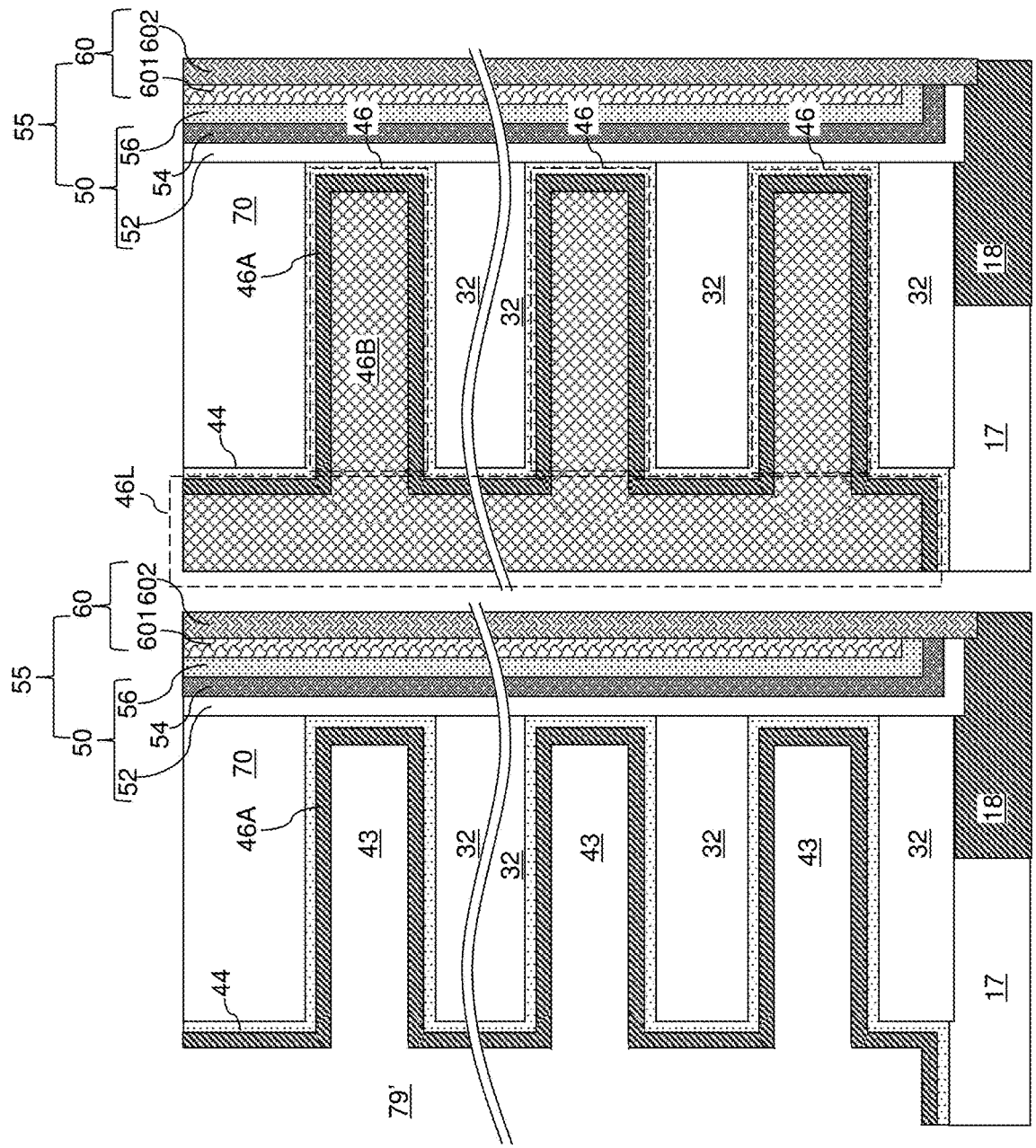

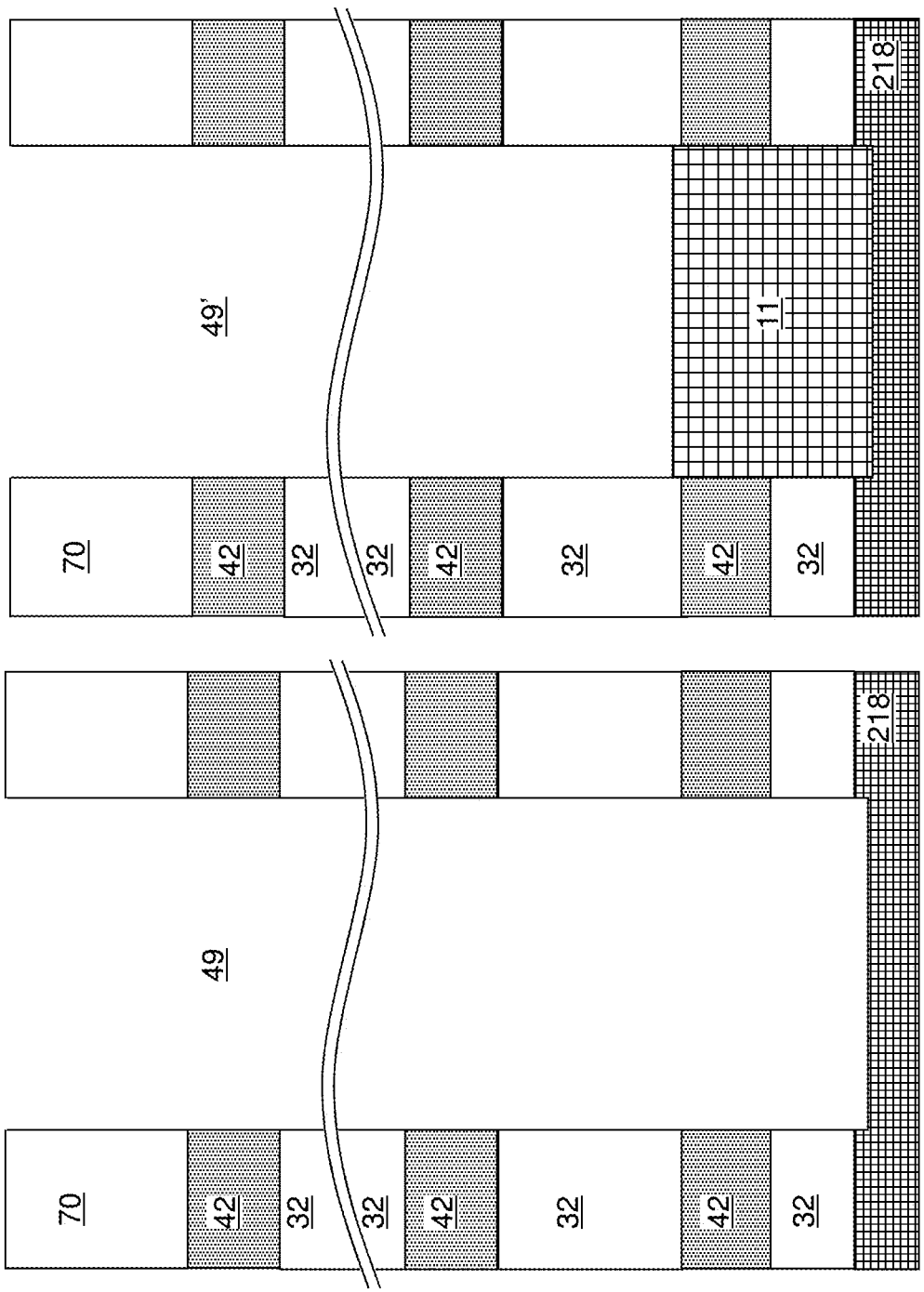

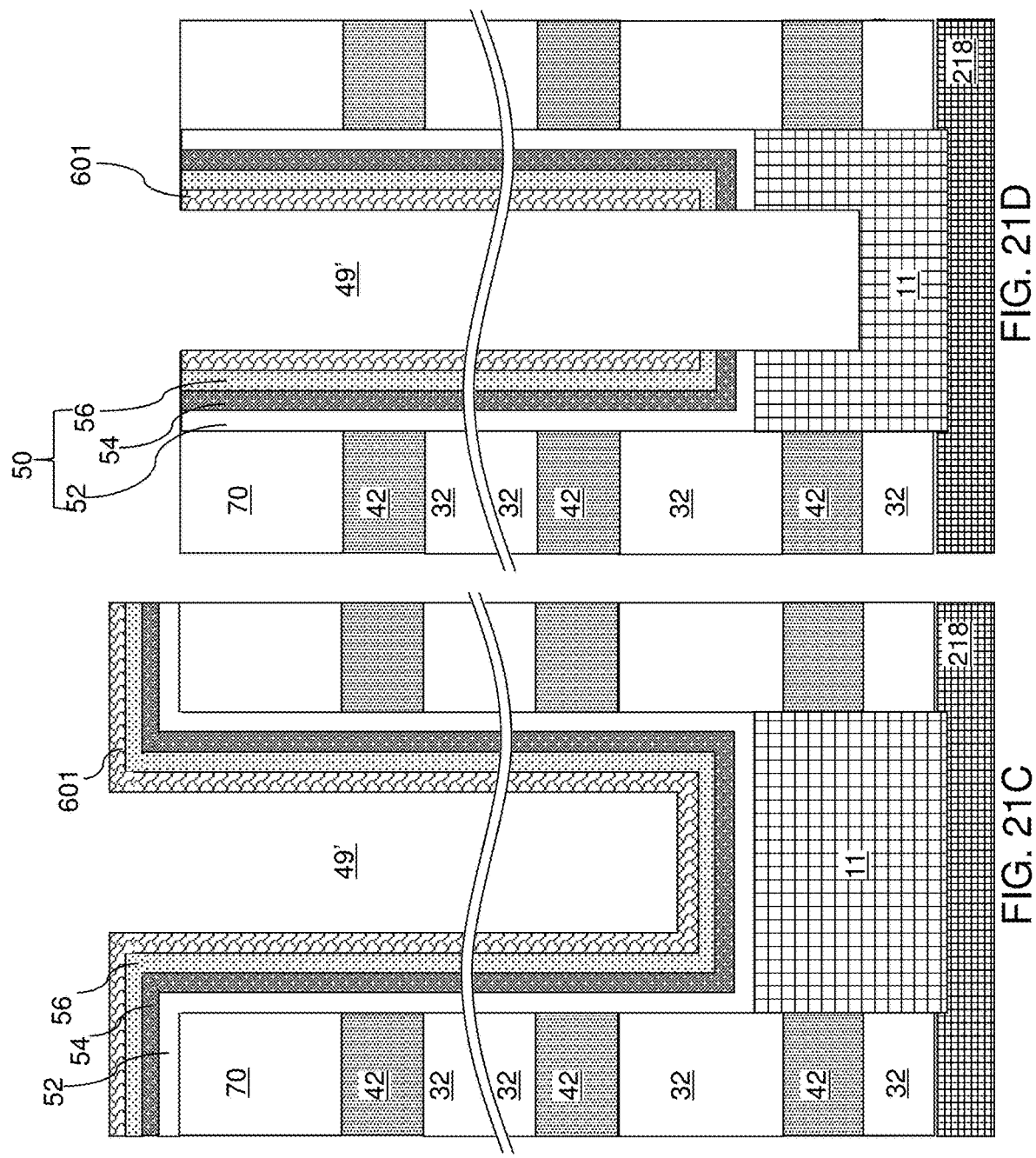

US 10,957,705 B2

THREE-DIMENSIONAL MEMORY DEVICES HAVING A MULTI-STACK BONDED STRUCTURE USING A LOGIC DIE AND MULTIPLE THREE-DIMENSIONAL MEMORY DIES AND METHOD OF MAKING THE SAME

FIELD

The present disclosure relates generally to the field of semiconductor devices, and particularly to a three-dimensional memory device having a multi-stack bonded structure using common signal paths among multiple three-dimensional memory dies and methods of manufacturing the same.

BACKGROUND

Three-dimensional memory devices including a three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises a first memory die comprising an array of first memory stack structures; a logic die bonded to a first side of the first memory die, wherein the logic die comprises a complementary metal oxide semiconductor (CMOS) circuit that includes a first peripheral circuitry electrically coupled to nodes of the array of first memory stack structures through a first subset of first metal interconnect structures included within the first memory die; and a second memory die that comprises an array of second memory stack structures and that is bonded to a second side of the first memory die, wherein the CMOS circuit of the logic die includes a second peripheral circuitry electrically coupled to nodes of the array of second memory stack structures through a second subset of first metal interconnect structures included within the first memory die and through second metal interconnect structures included within the second memory die.

According to another aspect of the present disclosure, a method of forming a three-dimensional memory device is provided, which comprises: providing a first memory die including an array of first memory stack structures; bonding a first side of the first memory die to a logic die, wherein the logic die comprises a complementary metal oxide semiconductor (CMOS) circuit that includes a first peripheral circuitry electrically coupled to nodes of the array of first memory stack structures through a first subset of first metal interconnect structures included within the first memory die; and bonding a second memory die to a second side of the first memory die, wherein the second memory die comprises an array of second memory stack structures, and the CMOS circuit of the logic die includes a second peripheral circuitry electrically coupled to nodes of the array of second memory stack structures through a second subset of first metal interconnect structures included within the first memory die and through second metal interconnect structures included within the second memory die.

BRIEF DESCRIPTION OF THE DRAWINGS

FIGS. 5A-5G are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

FIGS. 21A-21E are sequential schematic vertical cross-sectional views of a memory opening within the second memory die during formation of a memory stack structure, an optional dielectric core, and a drain region therein according to an embodiment of the present disclosure.

DETAILED DESCRIPTION

Figure 1:
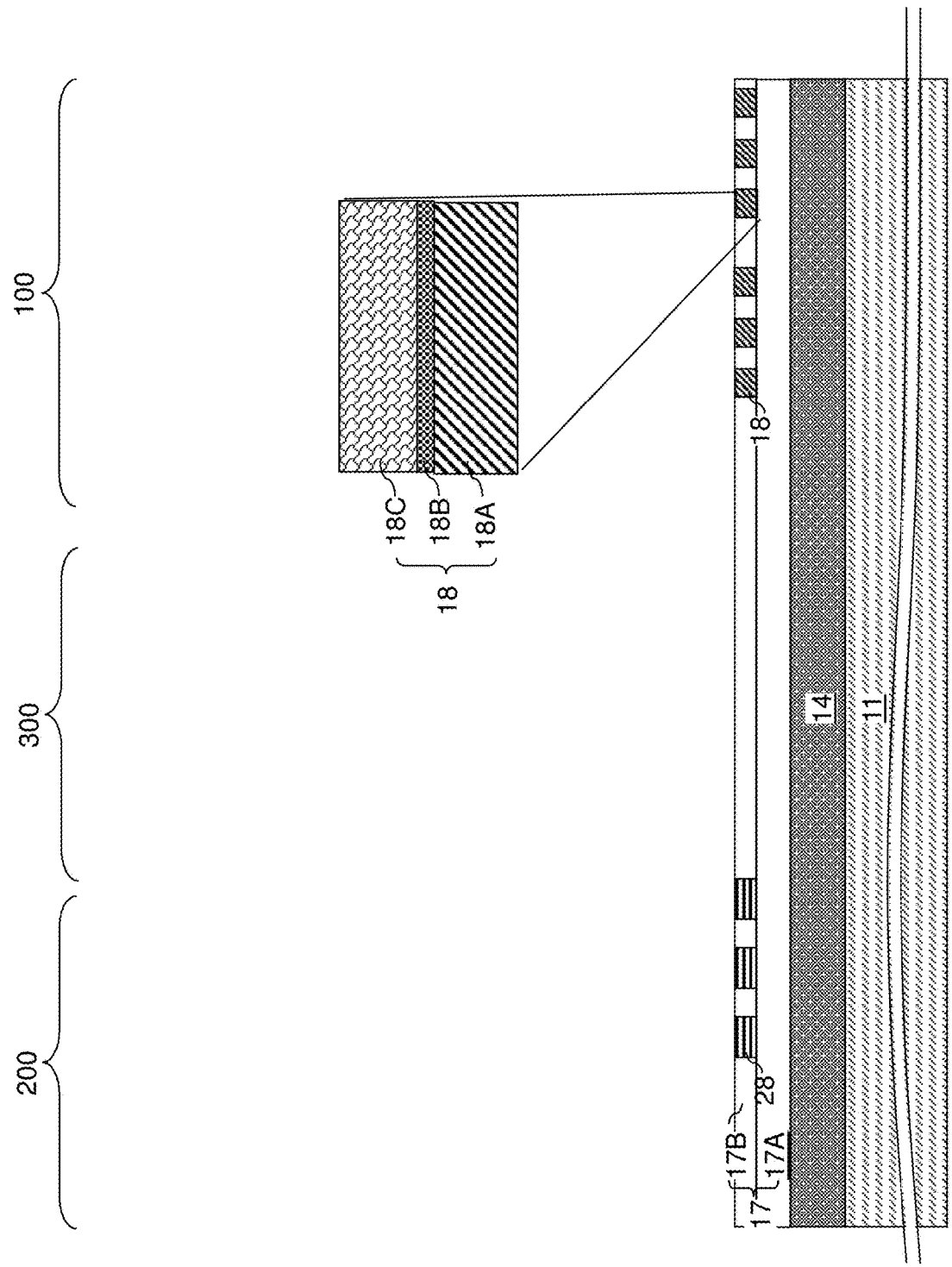
FIG. 1 is a schematic vertical cross-sectional view of an exemplary structure after formation of a sacrificial separation material layer, a dielectric matrix layer, and first distal bonding pads according to an embodiment of the present disclosure.

As discussed above, the present disclosure is directed to three-dimensional memory devices having a multi-stack bonded structure using common signal paths among multiple three-dimensional memory dies and methods of manufacturing the same, the various aspects of which are described below. The embodiments of the disclosure can be used to form various structures including a bonded assembly including multiple memory dies and a logic die that includes a peripheral circuitry that supports operation of memory elements within each of the multiple memory dies. A support circuitry is used to perform write, read, and erase operations of the memory cells in the vertical NAND strings. Typically, complementary metal oxide semiconductor (CMOS) devices are formed on a same substrate as the three-dimensional memory device. However, degradation of CMOS devices due to collateral thermal cycling and hydrogen diffusion during manufacture of the three-dimensional memory device places a severe constraint on performance of the support circuitry including the CMOS devices. Further, the number of word lines in an alternating stack of insulating layers and word lines may be limited due to constraints of the etch process used to pattern the alternating stack. Various embodiments of the present disclosure provide structures that can incorporate a greater number of word lines and a high-performance support circuitry than in conventional three-dimensional memory device structures made using conventional manufacturing methods.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component. Electrical components that are electrically connected to each other can be at the same electrical potential at all operating conditions of the device.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices of various embodiments of the present disclosure include a monolithic three-dimensional NAND string memory device, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In a memory die (i.e., a die including memory elements), concurrent read operations, concurrent write operations, or concurrent erase operations can be performed in each plane within the same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, an exemplary structure includes a carrier substrate 11, which is used to provide mechanical support to structures to be subsequently formed thereupon. The carrier substrate 11 can include a semiconductor substrate such as a silicon wafer, an insulating substrate, or a conductive substrate. A sacrificial separation material layer 14 can be formed on a front-side surface of the carrier substrate 11. The sacrificial material layer 14 includes a material that can be subsequently removed selective to the material of the carrier substrate 11. For example, the carrier substrate 11 can include a silicon wafer, and the sacrificial material layer 14 can include a silicon nitride layer that can be deposited on the front-side surface of the carrier substrate 11, for example, by chemical vapor deposition. The thickness of the sacrificial material layer 14 can be in a range from 50 nm to 500 nm, although lesser and greater thicknesses can also be used. The exemplary structure includes at least a memory array region 100 in which a three-dimensional memory array is subsequently formed, a staircase region 300 in which stepped surfaces of an alternating stack of insulating layers and electrically conductive layers are to be subsequently formed, and an interconnection region 200 in which interconnect via structures are to be subsequently formed.

A dielectric matrix layer 17 can be formed over the sacrificial separation material layer 14. The dielectric matrix layer 17 includes a dielectric material that can include bonding pad structures, which include first distal bonding pads (18, 28). The first distal bonding pads (18, 28) can include first distal memory-region bonding pads 18 formed in the memory array region 100, and first distal interconnection-region bonding pads 28 formed in the interconnection region 200. In one embodiment, the dielectric matrix layer 17 may include a planar dielectric matrix layer 17A and a patterned dielectric matrix layer 17B including discrete recessed regions. The first distal bonding pads (18, 28) can be formed by depositing at least one bonding pad material in the discrete recessed regions. In one embodiment, each of the first distal bonding pads (18, 28) can include a vertical stack of a copper layer 18A, a metallic nitride barrier layer 18B, and a semiconductor material layer 18C including a heavily doped semiconductor material having a doping of a first conductivity type, which may be p-type or n-type.

Figure 2:
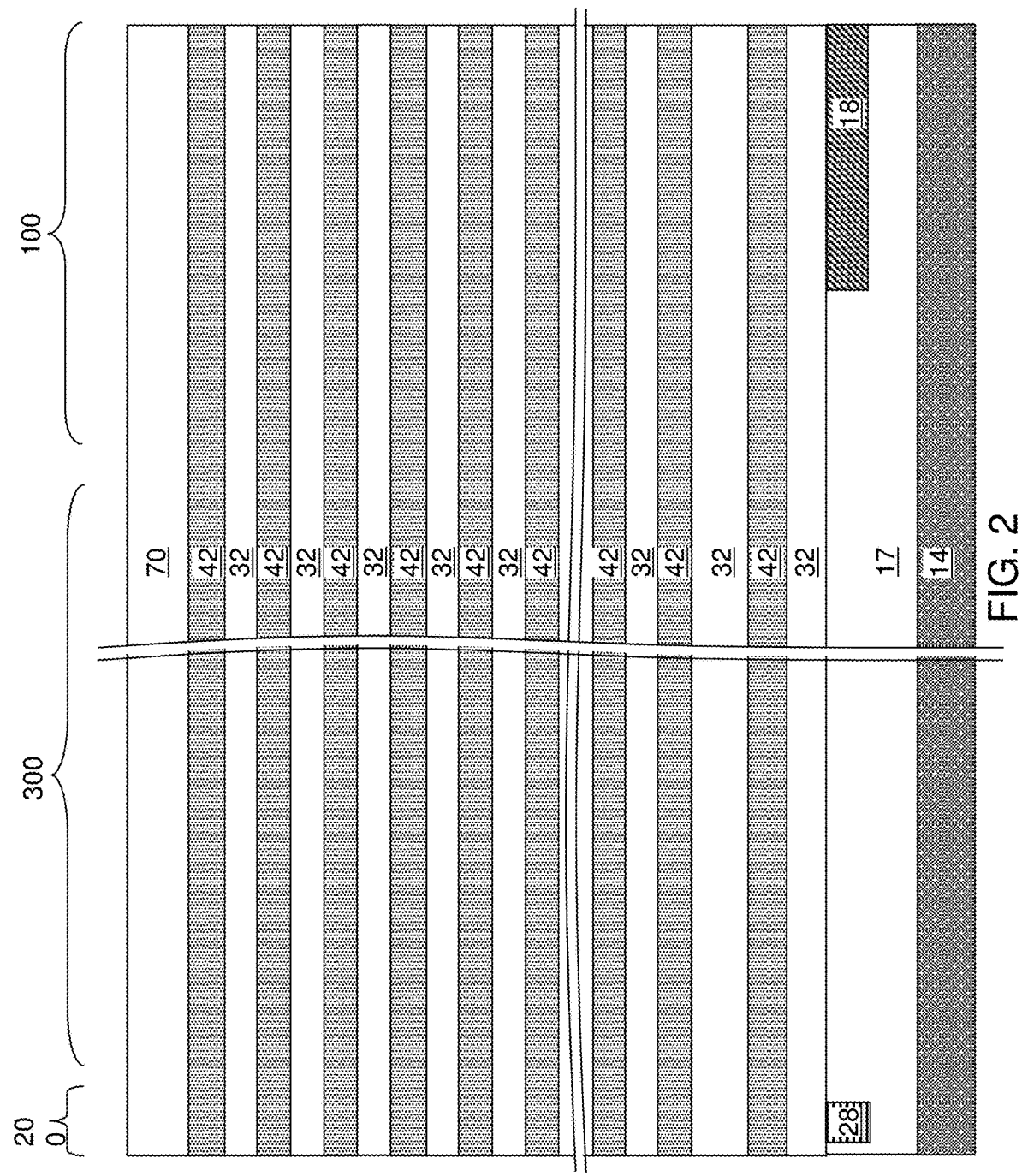
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the dielectric matrix layer 17. The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, in other embodiments the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
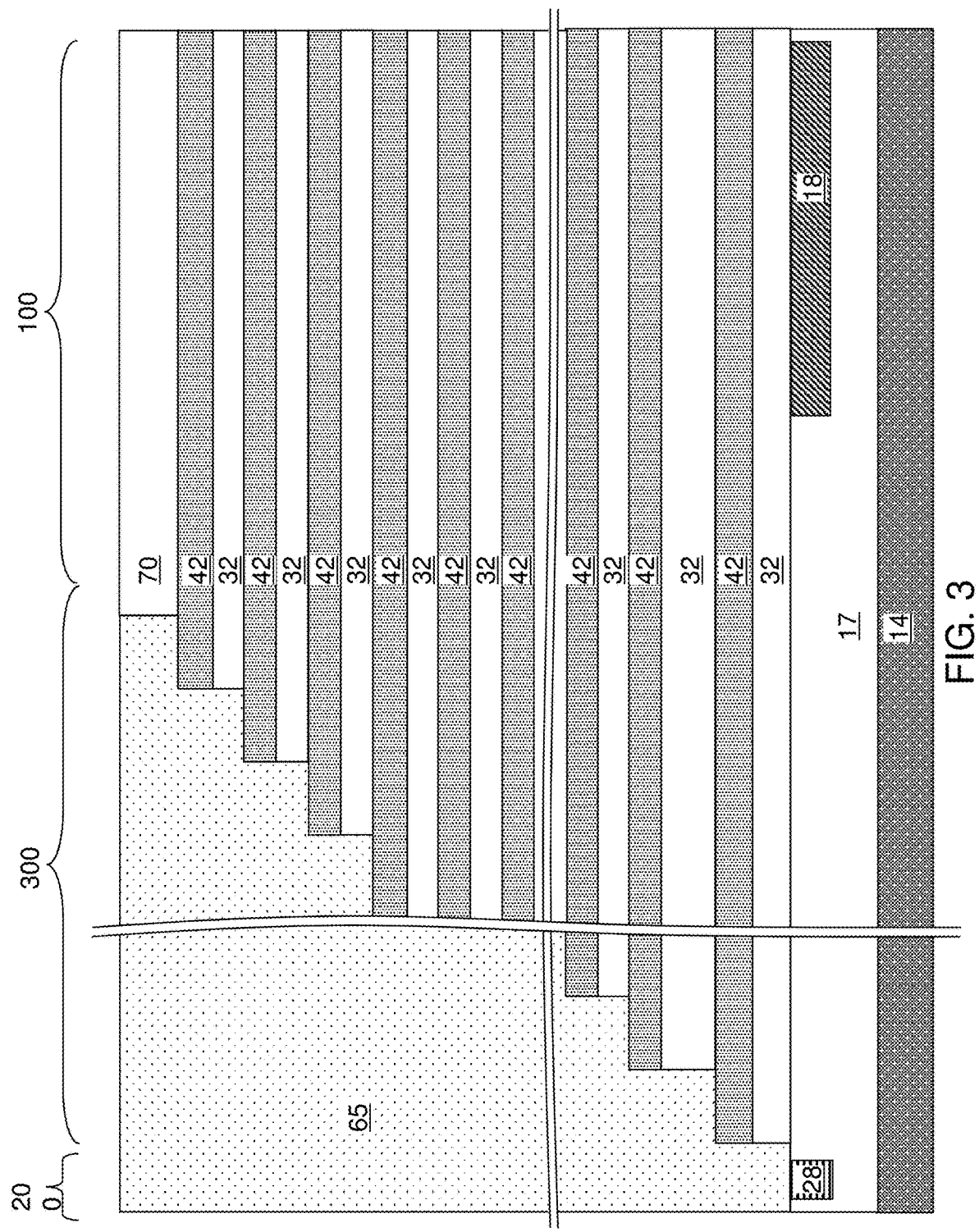
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the dielectric matrix layer 17. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer 42. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
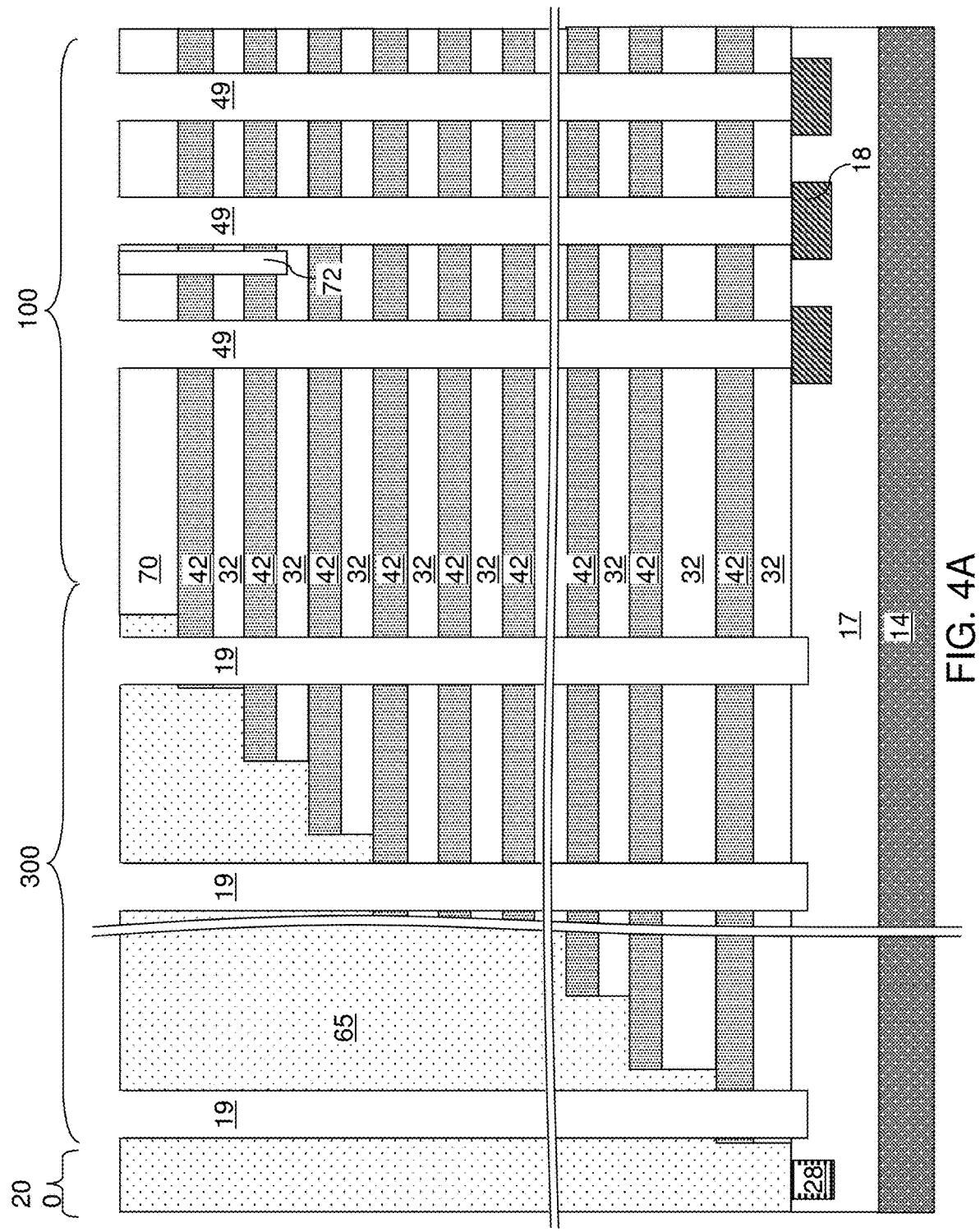
FIG. 4A is a schematic vertical cross-sectional view of the exemplary structure after formation of memory openings and support openings according to an embodiment of the present disclosure.
Figure 4B:
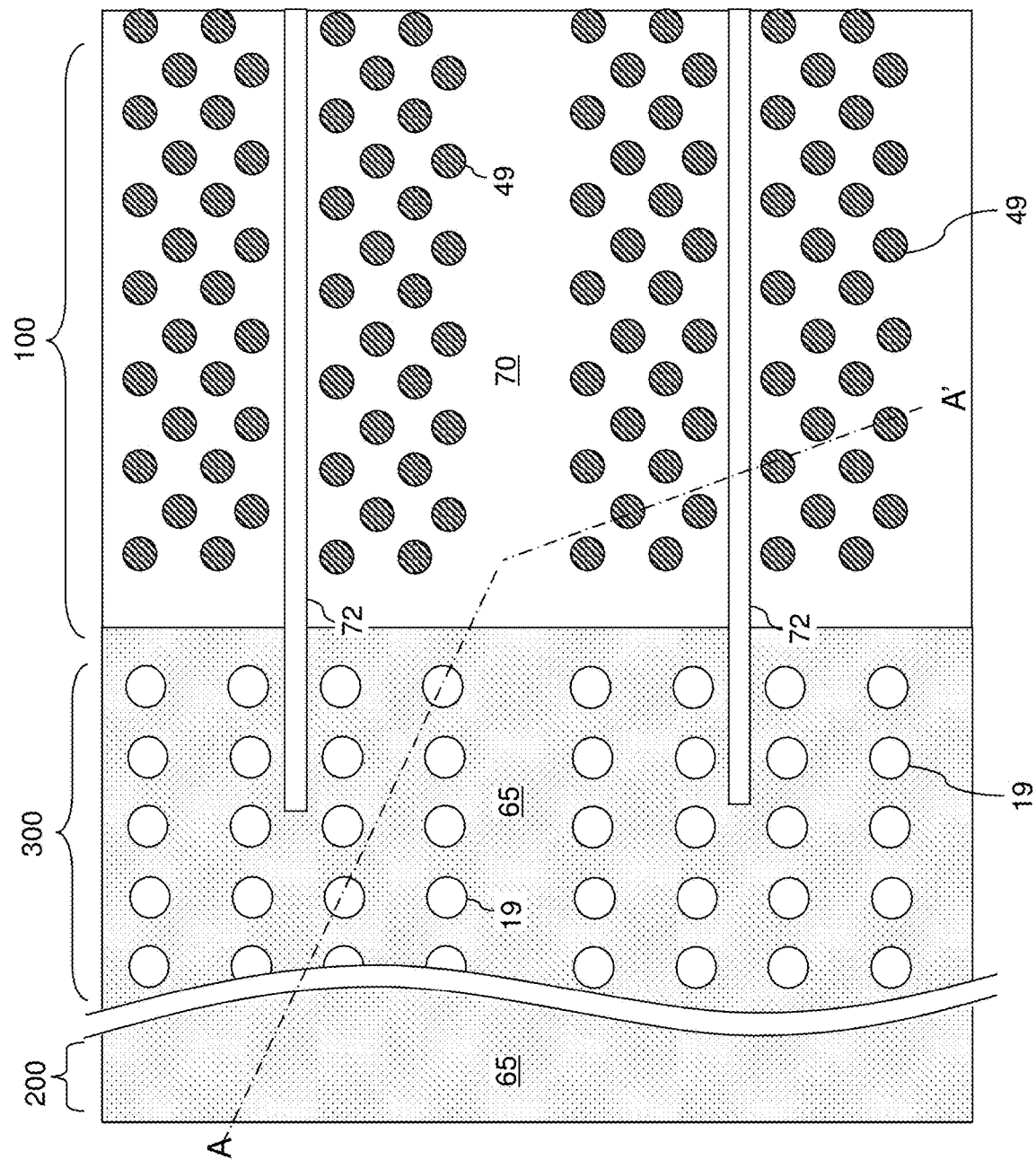
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 can extend from the top surface of the alternating stack (32, 42) to a respective one of the first distal memory-region bonding pads 18. The support openings 19 can extend from the top surface of the alternating stack (32, 42) to at least to the dielectric matrix layer 17. In one embodiment, an overetch into the first distal memory-region bonding pads 18 may be optionally performed after the top surface of a first distal memory-region bonding pads 18 is physically exposed at a bottom of each memory opening 49. The overetch may be performed prior to, or after, removal of the lithographic material stack. In other words, the recessed surfaces of the first distal memory-region bonding pads 18 may be vertically offset from the un-recessed top surfaces of the first distal memory-region bonding pads 18 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the dielectric matrix layer 17.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

FIGS. 5A-5G illustrate structural changes in a memory opening 49, which is one of the memory openings 49 in the exemplary structure of FIGS. 4A and 4B. The same structural change occurs simultaneously in each of the other memory openings 49 and in each support opening 19.

Figures 5A, 5B:
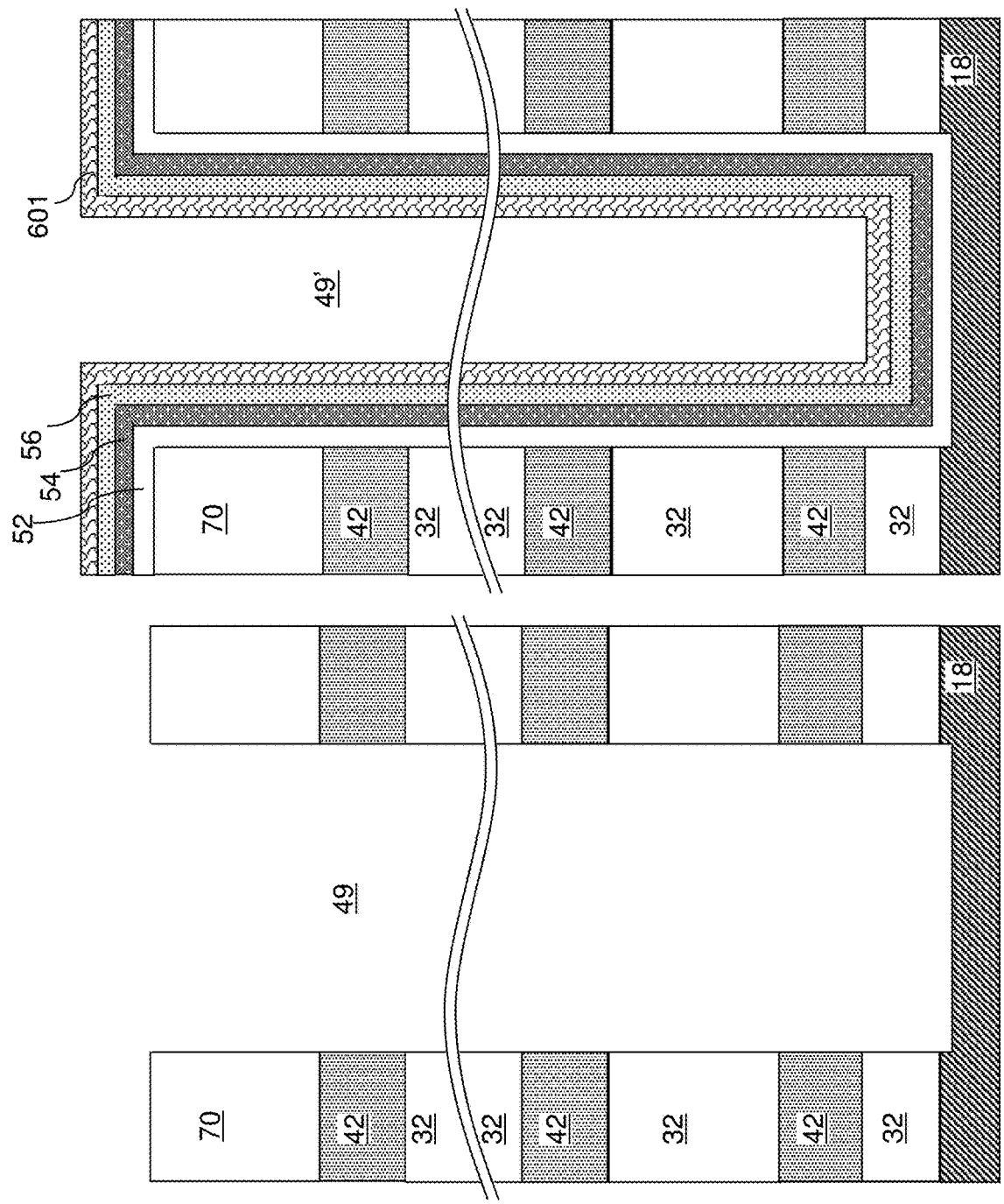

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of a respective first distal memory-region bonding pad 18. At this processing step, each support opening 19 can extend through the retro-stepped dielectric material portion 65, a subset of layers in the alternating stack (32, 42), and optionally through the upper portion of the dielectric matrix layer 17. The recess depth of the bottom surface of each memory opening 49 with respect to the top surface of a first distal memory-region bonding pad 18 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials and/or semiconductor materials. Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the semiconductor material layer 18C can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the semiconductor material layer 18C by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5F:
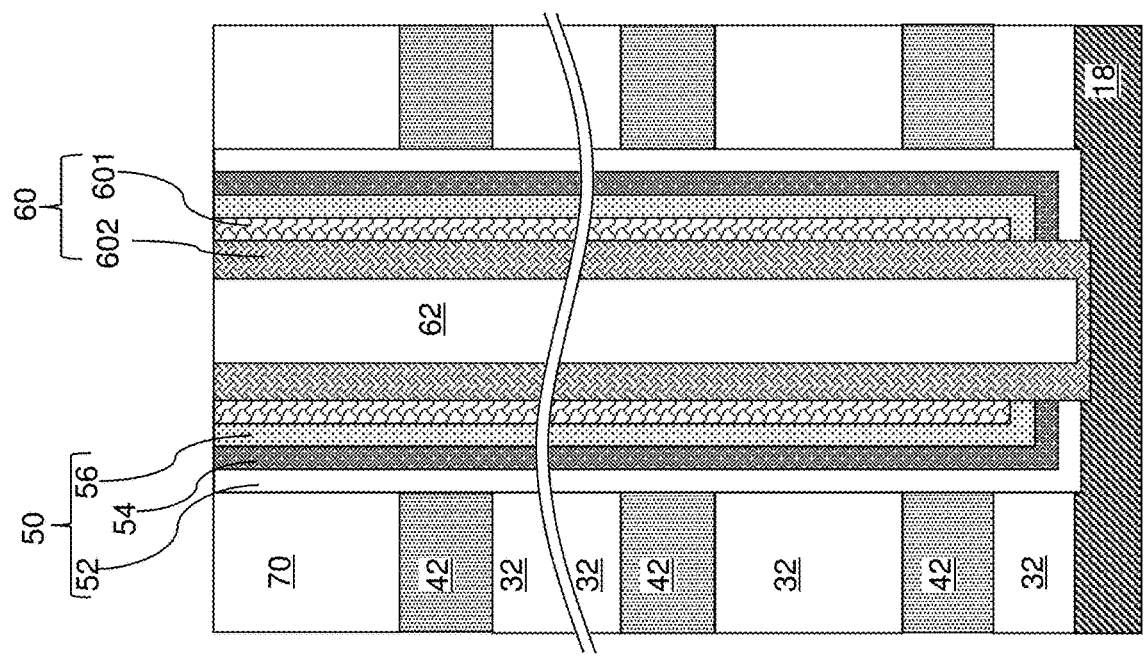
Figure 5E:
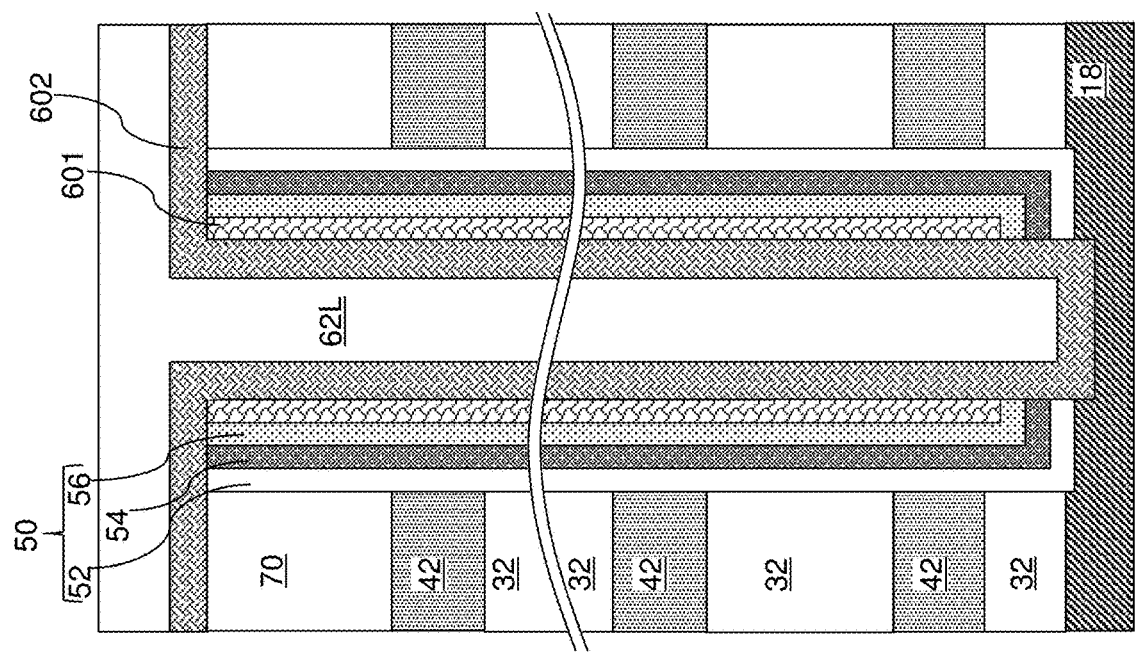

Referring to FIG. 5E, a second semiconductor channel layer 602 can be deposited directly on the semiconductor surface of the semiconductor material layer 18C, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
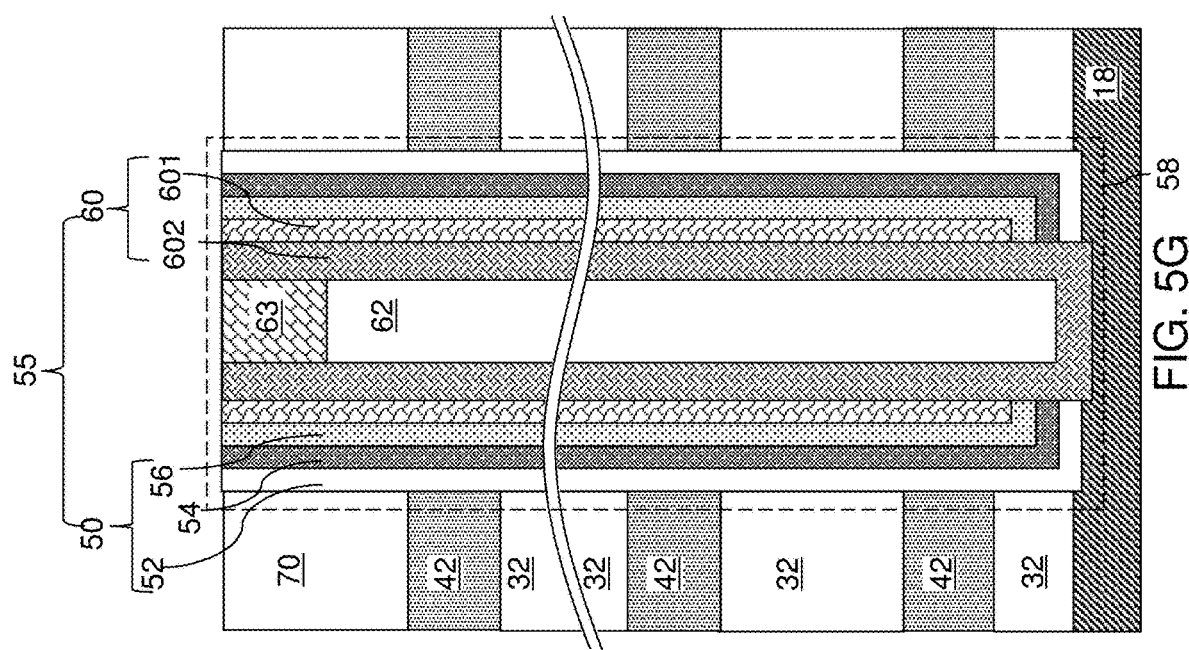

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can use a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a memory stack structure 55, a dielectric core 62, and a drain region 63 within a memory opening 49 is herein referred to as a memory opening fill structure 58. Each combination of a memory film 50, a vertical semiconductor channel 60, a dielectric core 62, and a drain region 63 within each support opening 19 fills the respective support openings 19, and constitutes a support pillar structure.

Figure 6:
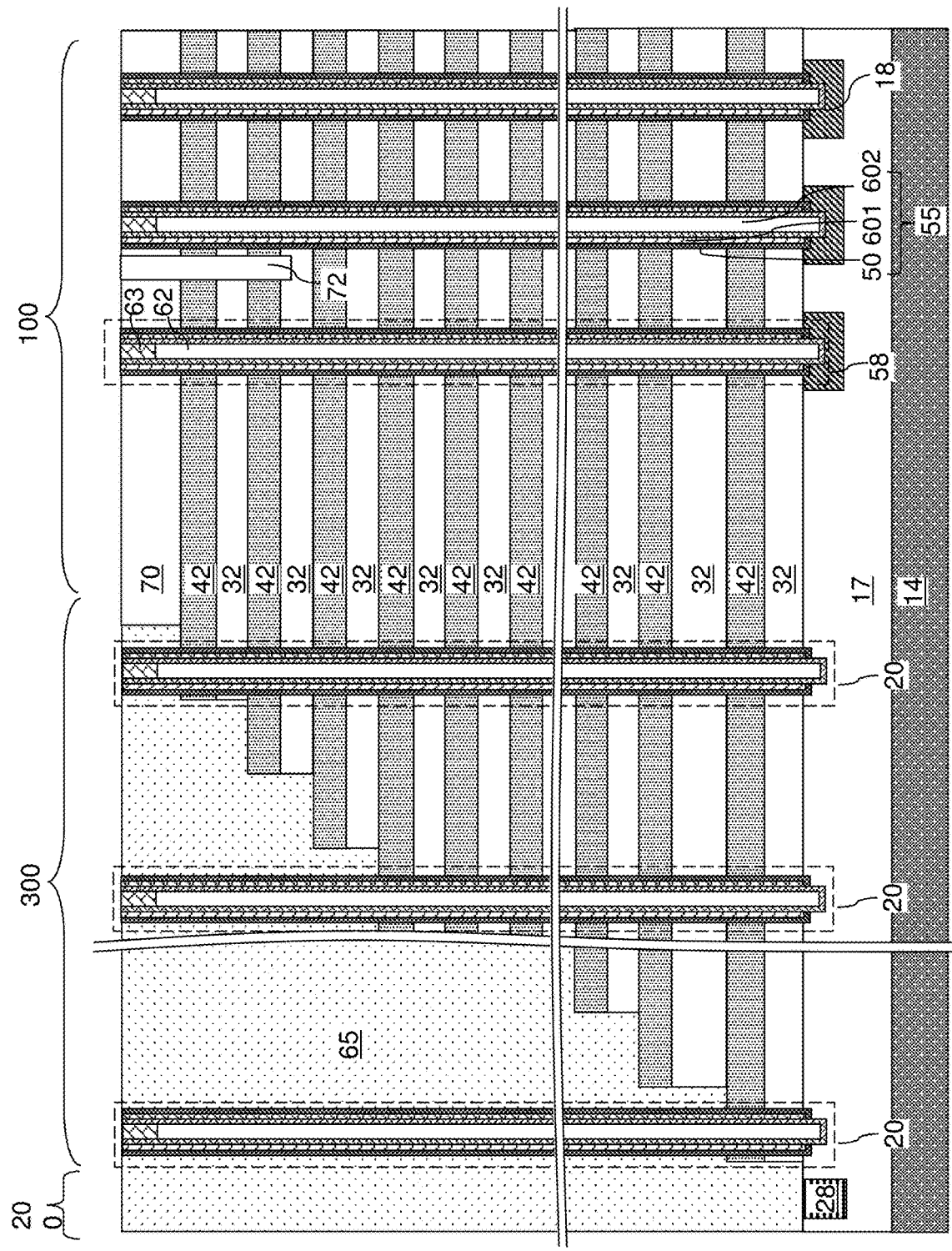
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described using the illustrated configuration for the memory stack structure, the methods of various embodiments of the present disclosure can be applied to alternative memory stack structures including different layer stacks or structures for the memory film 50 and/or for the vertical semiconductor channel 60.

Figure 7A:
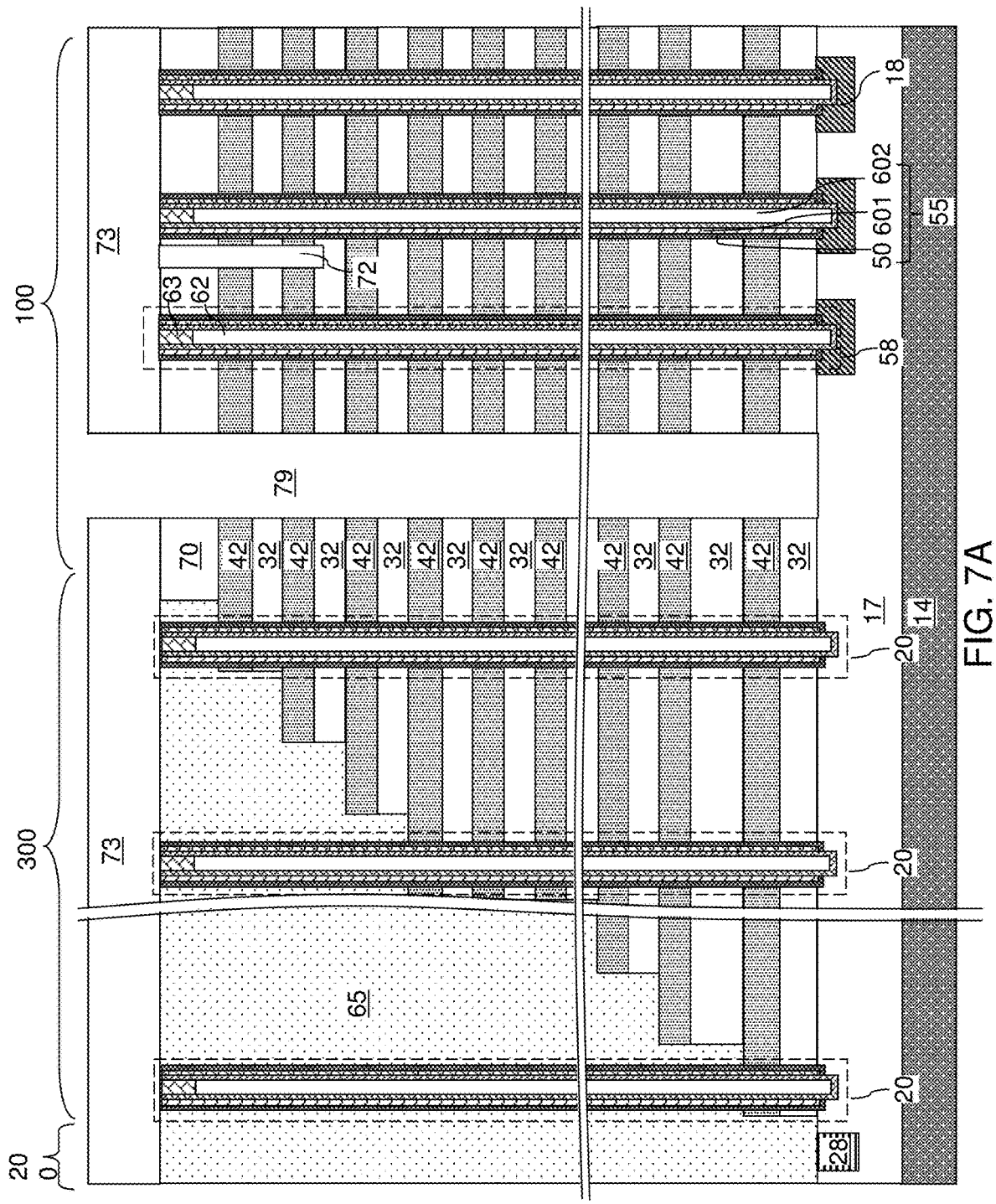
FIG. 7A is a schematic vertical cross-sectional view of the exemplary structure after formation of backside trenches according to an embodiment of the present disclosure.
Figure 7B:
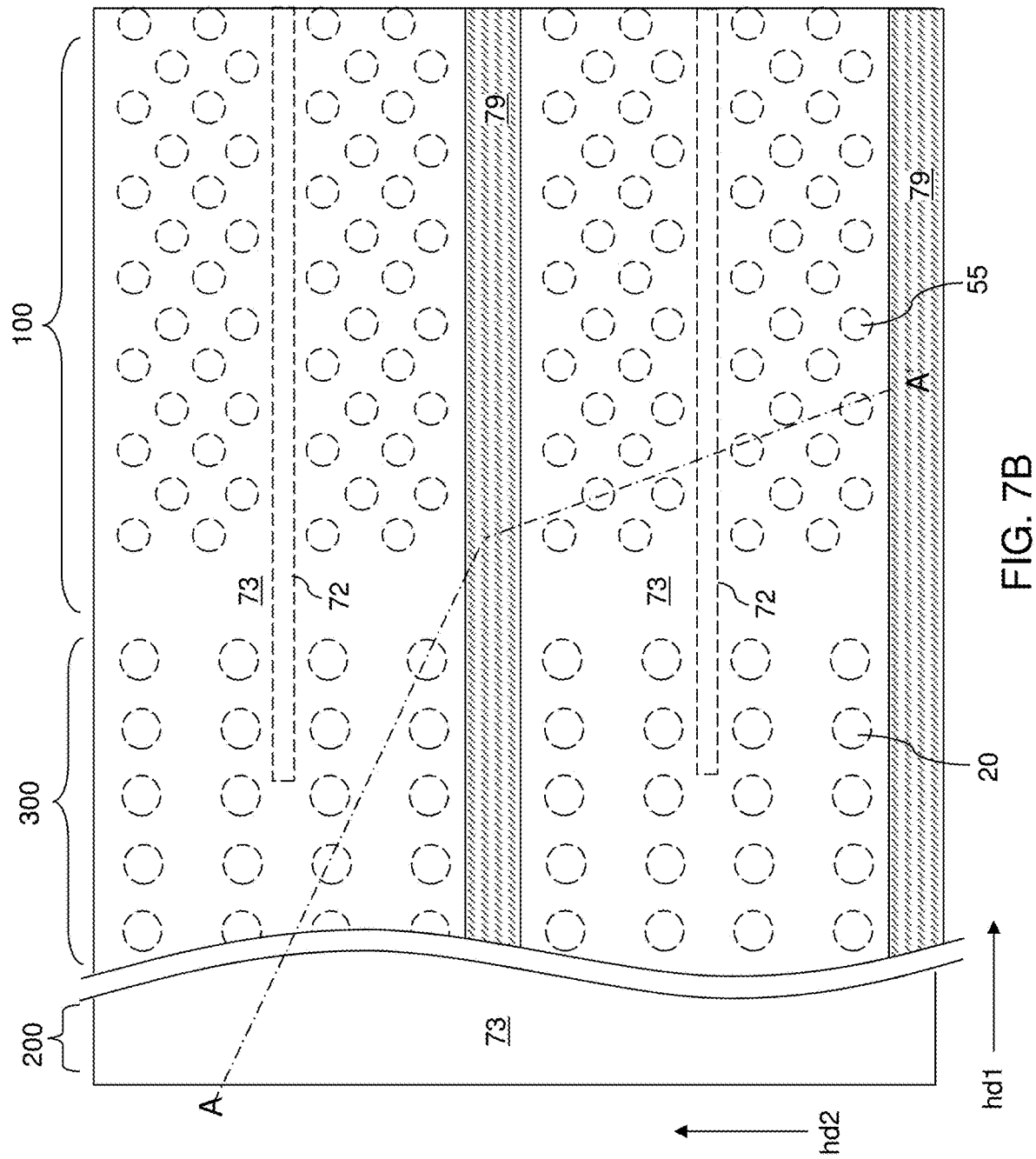
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the dielectric matrix layer 17, and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
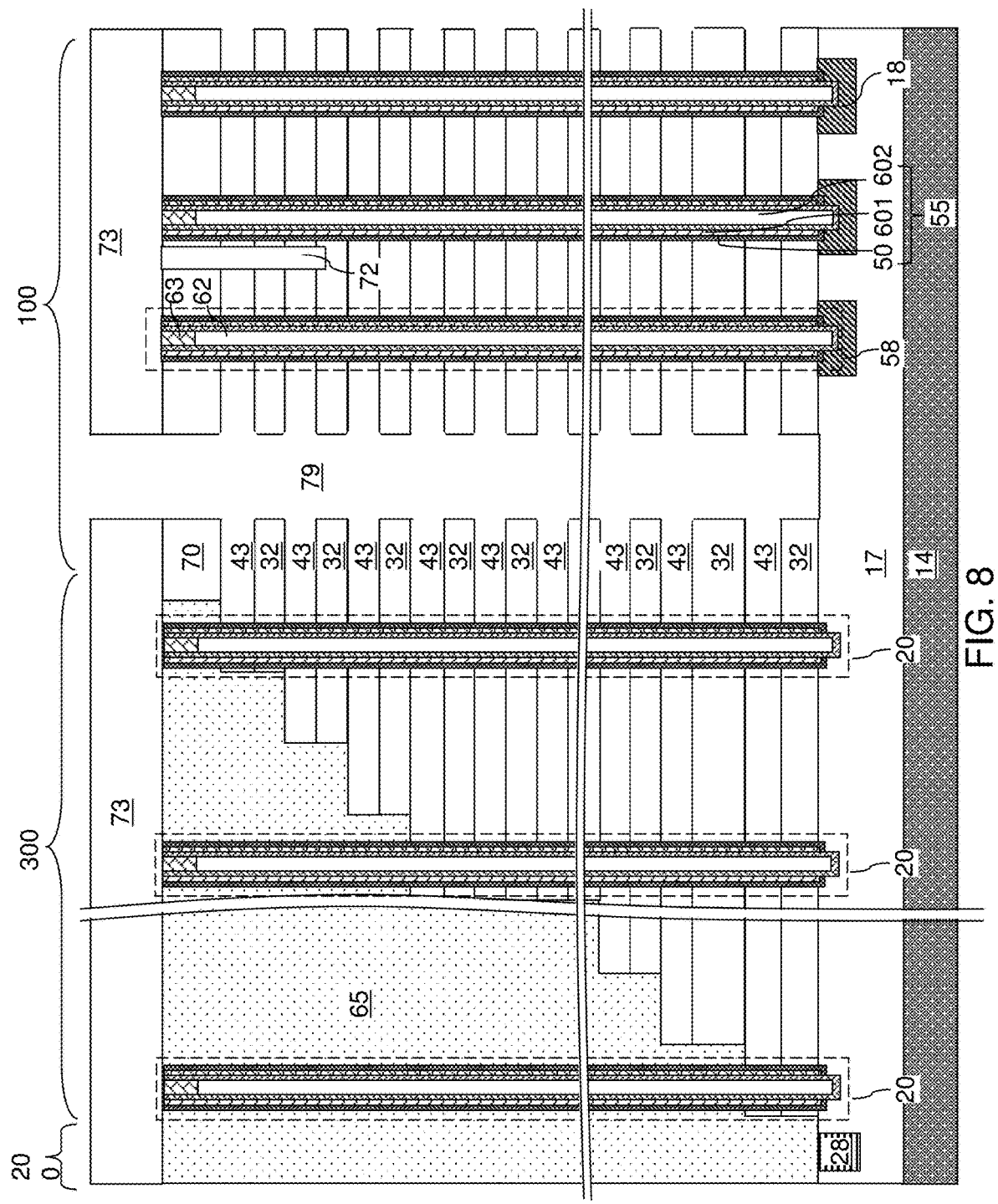
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, using an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the dielectric matrix layer 17. In this case, each backside recess 43 can define a space for receiving a respective word line of the array of monolithic three-dimensional NAND strings.

Each of the plurality of backside recesses 43 can extend substantially parallel to the top surface of the dielectric matrix layer 17. A backside recess 43 can be vertically bounded by a top surface of an underlying insulating layer 32 and a bottom surface of an overlying insulating layer 32. In one embodiment, each backside recess 43 can have a uniform height throughout.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, and the portions of the sidewall surfaces of the memory stack structures 55 that are physically exposed to the backside recesses 43. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Figure 10:
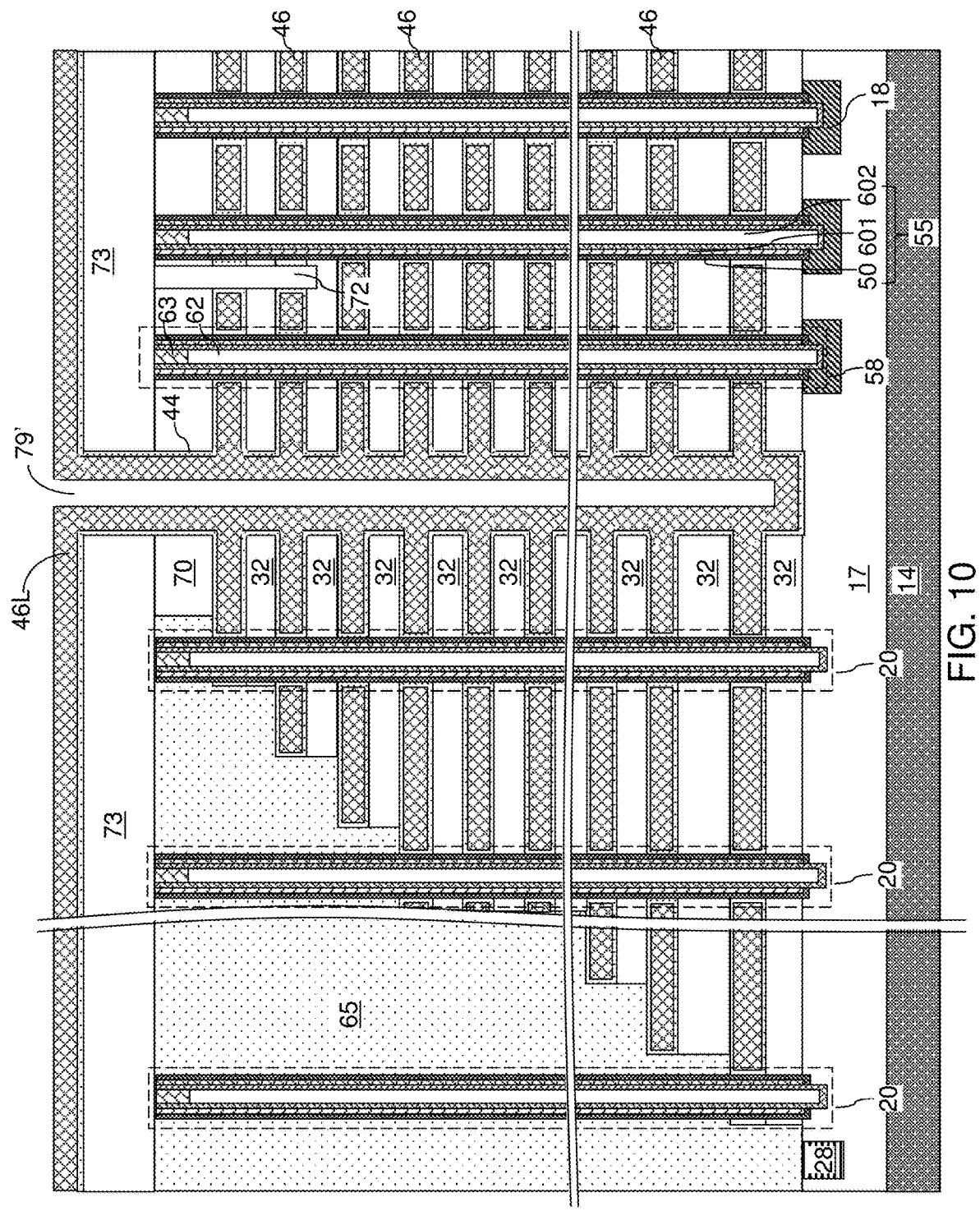
FIG. 10 is a schematic vertical cross-sectional view of the exemplary structure after formation of electrically conductive layers according to an embodiment of the present disclosure.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L.

Figure 11A:
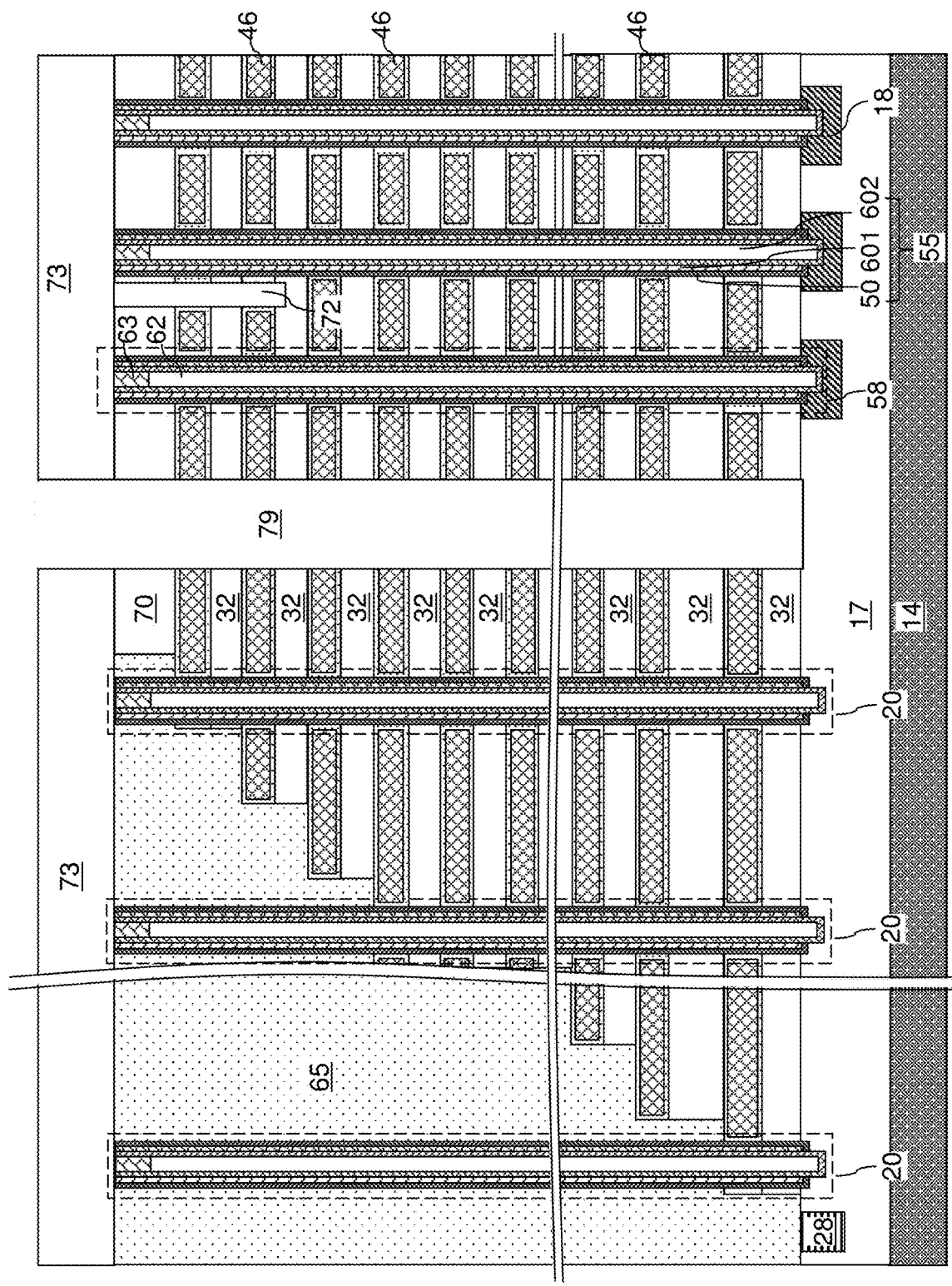
FIG. 11A is a schematic vertical cross-sectional view of the exemplary structure after removal of a deposited conductive material from within the backside trench according to an embodiment of the present disclosure.
Figure 11B:
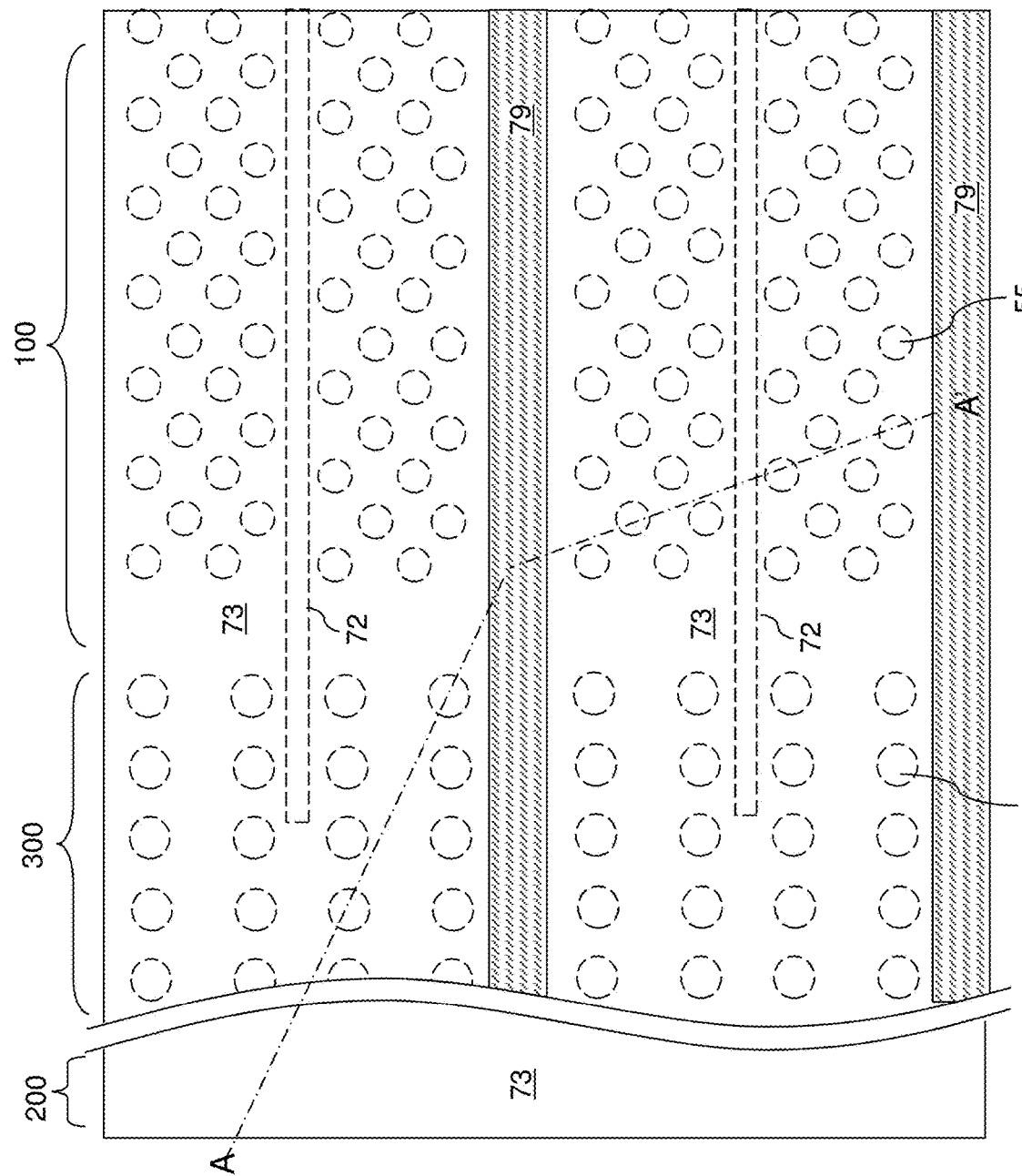
FIG. 11B is a partial see-through top-down view of the exemplary structure of FIG. 11A. The vertical plane A-A' is the plane of the schematic vertical cross-sectional view of FIG. 11A.

Referring to FIGS. 11A-11C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. A backside cavity 79' is present within each backside trench 79.

Figure 12:
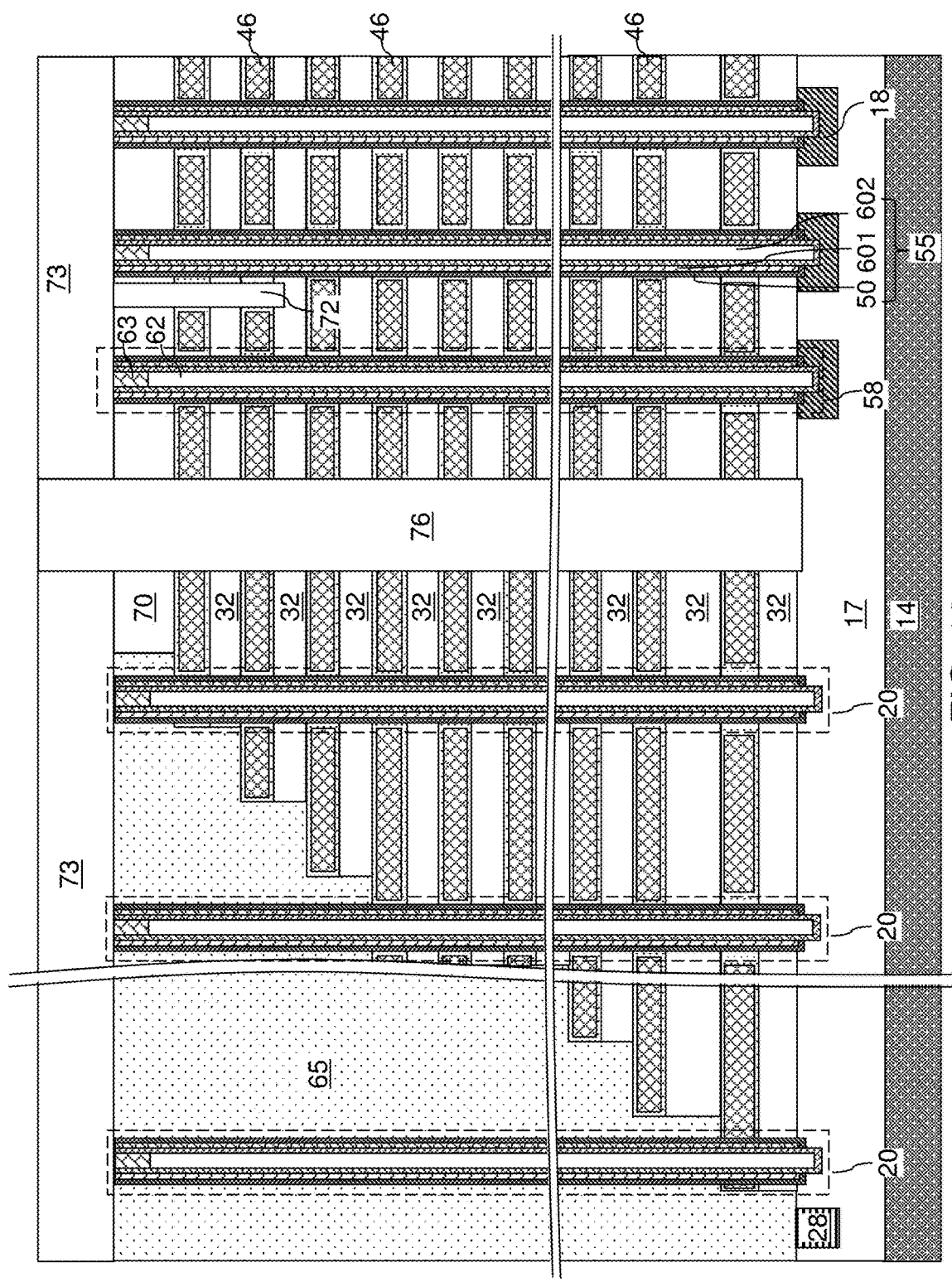
FIG. 12 is a schematic vertical cross-sectional view of the exemplary structure after formation of insulating wall structures according to an embodiment of the present disclosure.

Referring to FIGS. 12A and 12B, an insulating material can be deposited in the backside trenches 79 by a conformal deposition process to form dielectric wall structures 76. The insulating material includes an insulating material such as silicon oxide, silicon nitride, a dielectric metal oxide, an organosilicate glass, or a combination thereof. In one embodiment, the insulating material can include silicon oxide.

Figure 13A:
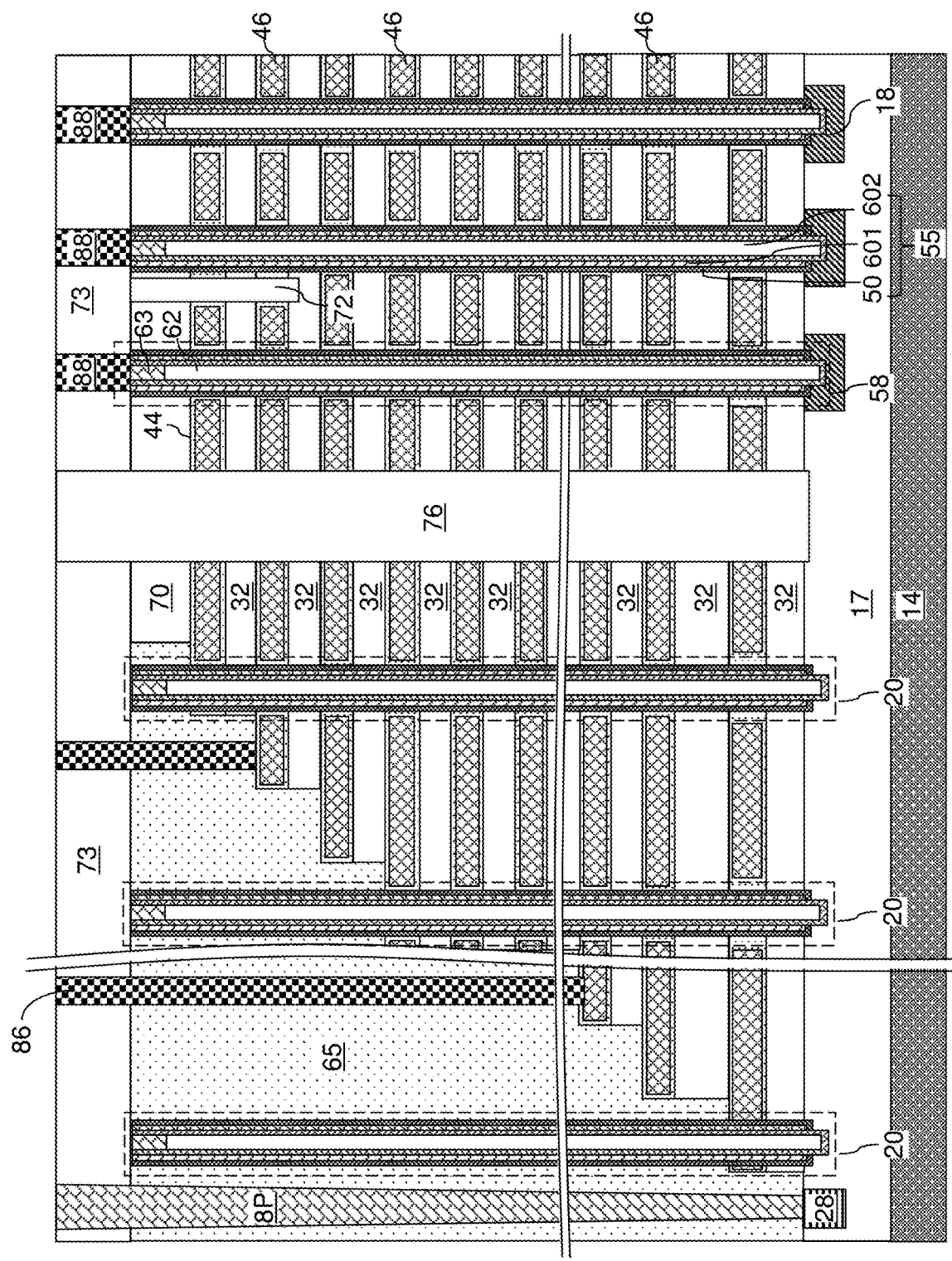
FIG. 13A is a schematic vertical cross-sectional view of the exemplary structure after formation of contact via structures according to an embodiment of the present disclosure.
Figure 13B:
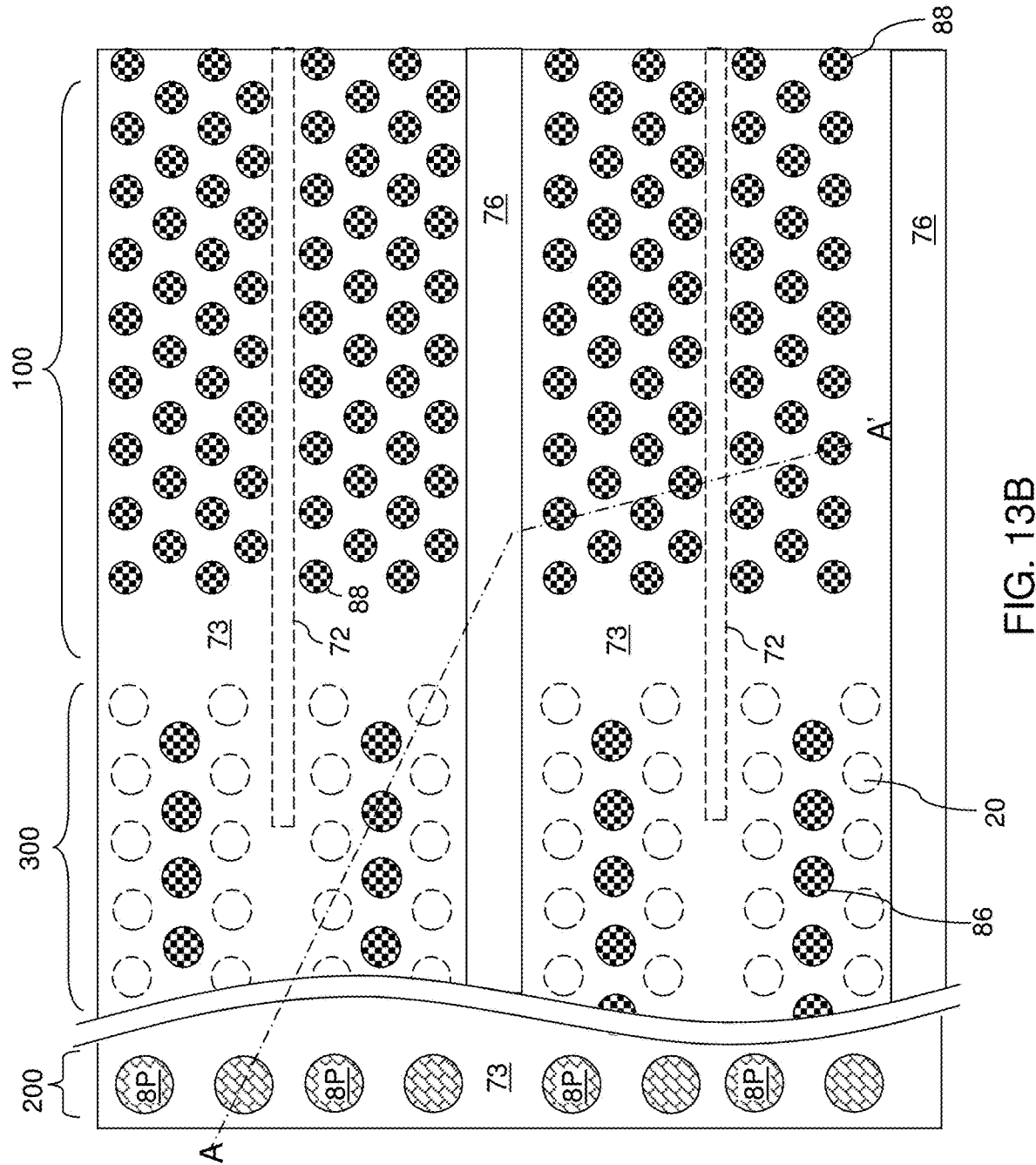
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Pass-through via structures 8P can be formed through the retro-stepped dielectric material portion 65 directly on respective nodes of the peripheral devices.

Figure 14A:
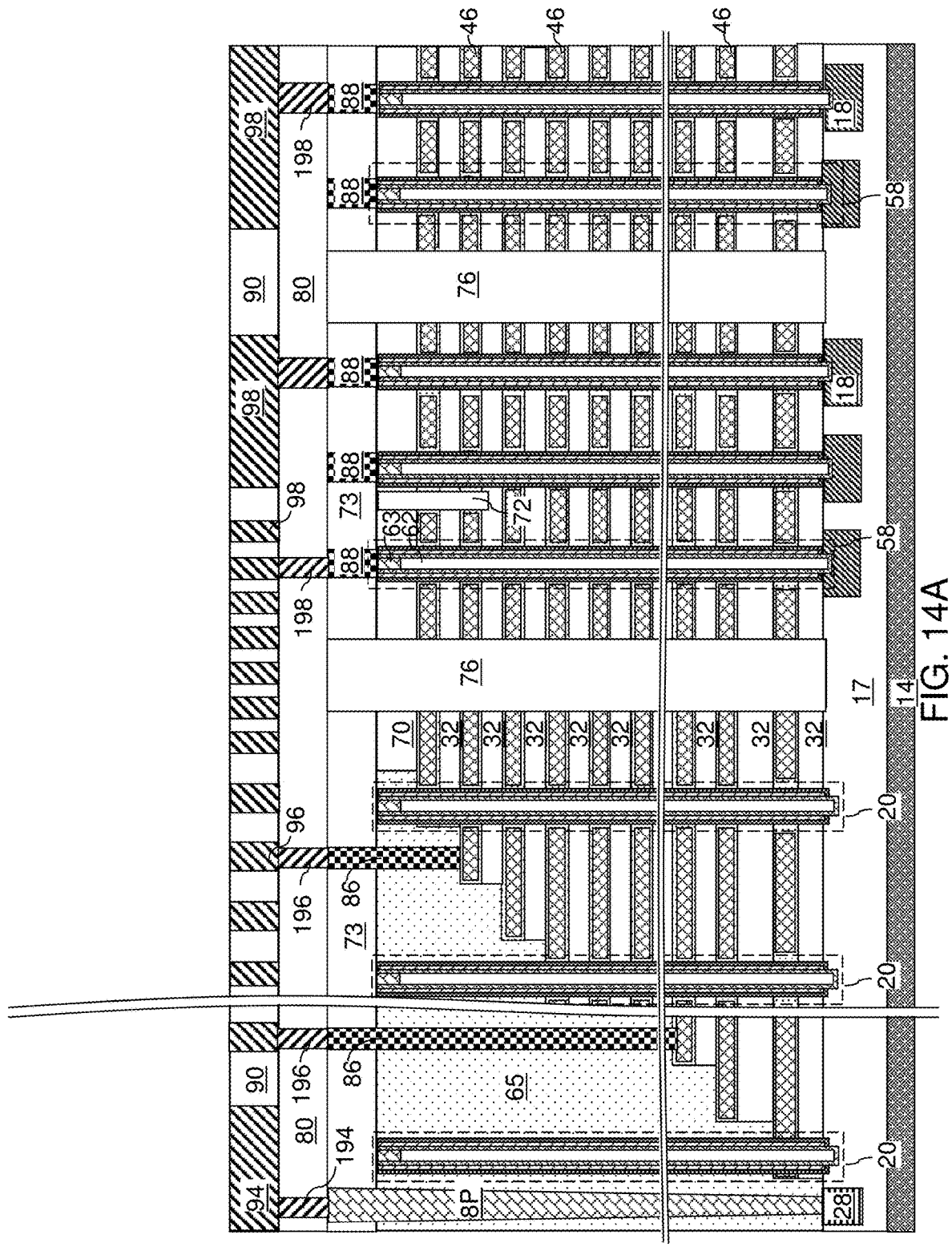
FIG. 14A is a schematic vertical cross-sectional view of the exemplary structure after formation of first via level metal interconnect structures and first line level metal interconnect structures according to an embodiment of the present disclosure.
Figure 14B:
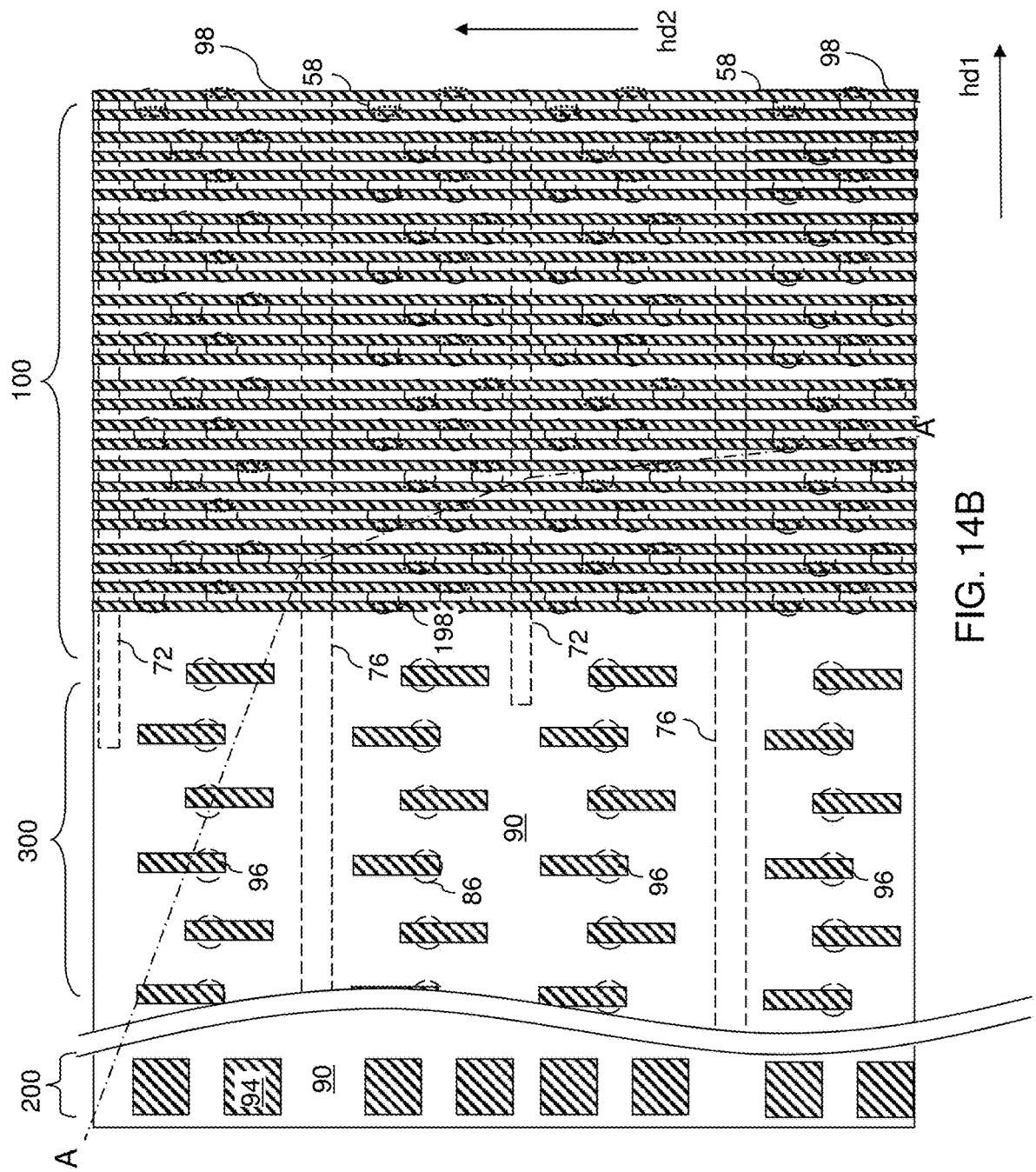
FIG. 14B is a partial see-through top-down view of the exemplary structure of FIG. 14A. The vertical plane A-A' is the plane of the schematic vertical cross-sectional view of FIG. 14A.

Referring to FIGS. 14A and 14B, a via level dielectric layer 80 is formed over the contact level dielectric layer 73. Various contact via structures (198, 196, 194) can be formed through the via level dielectric layer 80. For example, bit line connection via structures 198 can be formed on the drain contact via structures 88, word line connection via structures 196 can be formed on the word line contact via structures 86, and peripheral extension via structures 194 can be formed on the pass-through via structures 8P.

A first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 98 that are electrically connected to a respective one of the word line contact via structures 86 (for example, through a bit line connection via structure 198), and peripheral metal interconnect lines 94 that are electrically connected to a respective one of the pass-through via structures 8P (for example, through a peripheral extension via structure 194).

The bit lines 98 are electrically connected to upper ends of a respective subset of the vertical semiconductor channels 60 in the memory stack structures 55 in the memory array region 100. In one embodiment, the memory stack structures 55 are arranged in rows that extend along the first horizontal direction hd1, and the bit lines 98 laterally extend along the second horizontal direction hd2.

Figure 15:
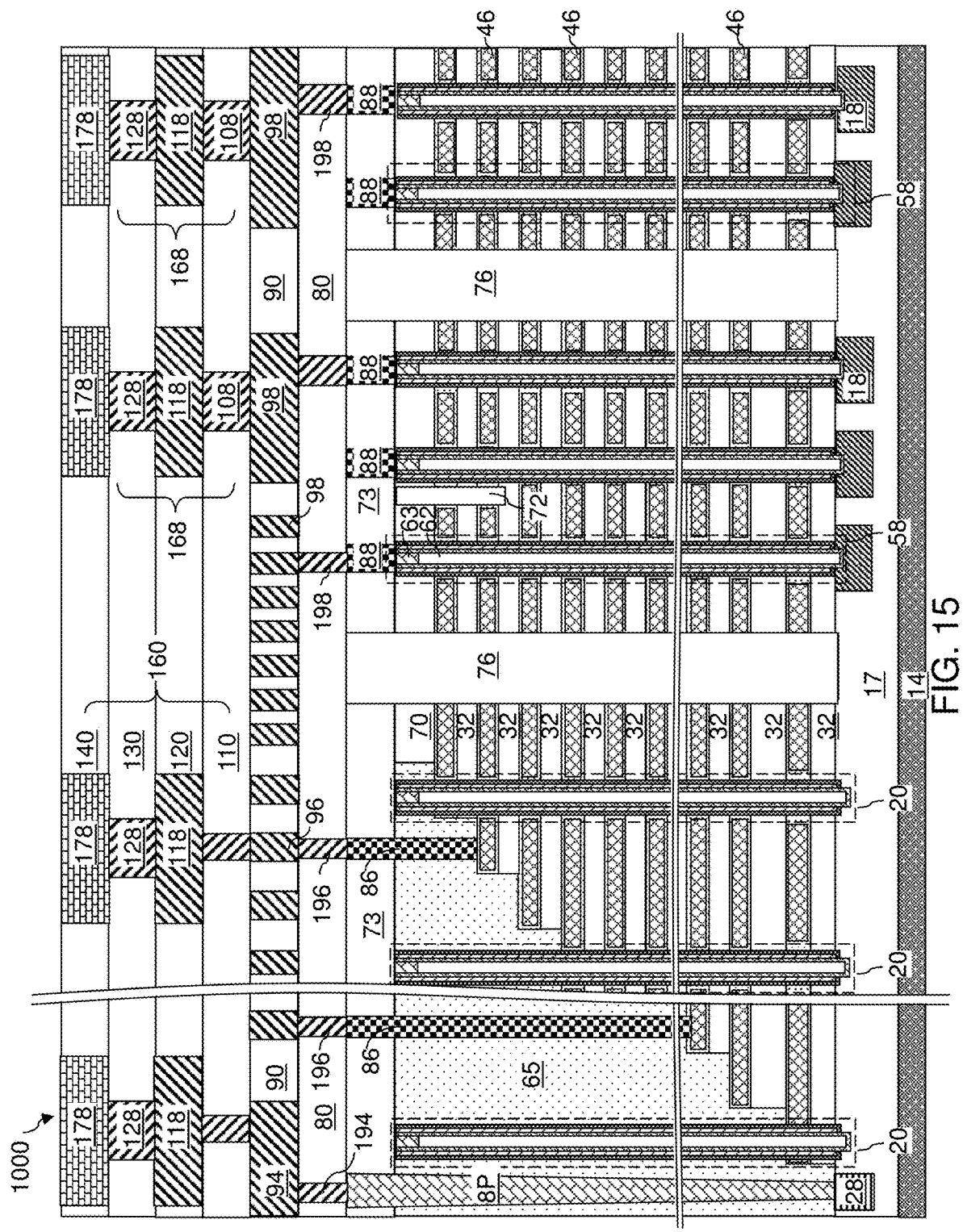
FIG. 15 is a schematic vertical cross-sectional view of the exemplary structure after formation of additional metal interconnect structures and first proximal bonding pads according to an embodiment of the present disclosure.

Referring to FIG. 15, a first memory die 1000 is provided by performing additional processing steps on the exemplary structure of FIGS. 14A and 14B. Specifically, additional metal interconnect structures 168 included in additional interconnect level dielectric layers 160 are formed. In an illustrative example, the additional interconnect level dielectric layers 160 can include a first via level dielectric layer 110, a second line level dielectric layer 120, a second via level dielectric layer 130, and a metallic pad structure level dielectric layer 140. The metal interconnect structures 168 can include first metal via structures 108 included in the first via level dielectric layer 110, second metal line structures 118 included within the second line level dielectric layer 120, second metal via structures 128 included in the second via level dielectric layer 130, and metallic pad structures 178 included in the metallic pad structure level dielectric layer 140. While the present disclosure is described using an example in which the additional interconnect level dielectric layers 160 include the first via level dielectric layer 110, the second line level dielectric layer 120, the second via level dielectric layer 130, and the metallic pad structure level dielectric layer 140, in other embodiments the additional interconnect level dielectric layers 160 include a different number and/or different combinations of dielectric material layers. The first memory die 1000 includes a three-dimensional array of first memory elements. Electrical connection paths can be provided by each combination of a metallic pad structure 178 and a set of metal interconnect structures {(194, 94, 108, 118, 128), (196, 96, 108, 118, 128), or (198, 98, 108, 118, 128)}.

The memory stack structures 55 in the first memory die 1000 are herein referred to as first memory stack structures 55. Thus, the first memory die 1000 includes an array of first memory stack structures 55. The vertical semiconductor channels 60 within the first memory stack structures 55 are herein referred to as first vertical semiconductor channels 60. The memory films 50 within the first memory stack structures 55 are herein referred to as first memory films 50. Each first memory stack structure 55 within the array of first memory stack structures 55 comprises a respective first vertical semiconductor channel 60 contacting a respective first memory film 50. The insulating layers 32 within the first memory die 1000 are herein referred to as first insulating layers 32, and the electrically conductive layers 46 within the first memory die 1000 are herein referred to as first electrically conductive layers 46. The alternating stack (32, 46) of the insulating layers 32 and the electrically conductive layers 46 in the first memory die 1000 is herein referred to as a first alternating stack (32, 46). Thus, the first memory die 1000 comprises a first alternating stack (32, 46) of first insulating layers 32 and first electrically conductive layers 46 through which the array of first memory stack structures 55 extends.

Figure 16:
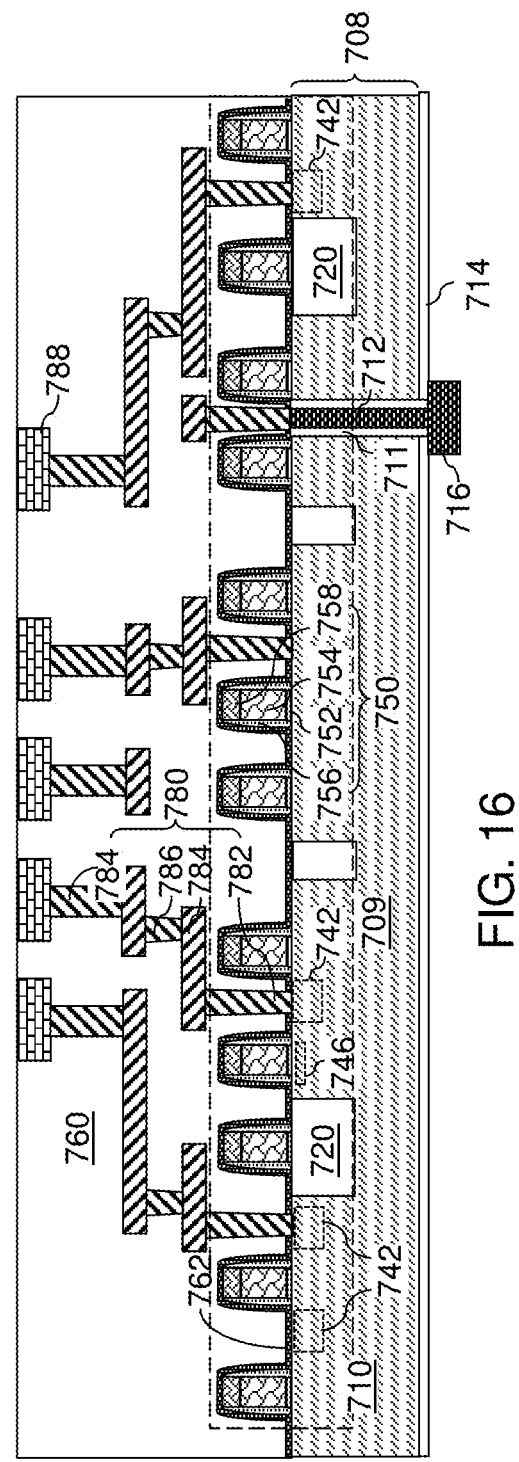
FIG. 16 is a schematic vertical cross-sectional view of a logic die according to an embodiment of the present disclosure.

Referring to FIG. 16, a logic die 700 including various semiconductor devices 710 is provided. The semiconductor devices 710 includes a first peripheral circuitry for operation of the three-dimensional memory arrays in the first memory die 1000. The first peripheral circuitry can include a first word line driver that drives the first electrically conductive layers 46 within the first memory die 1000, a bit line driver that drives the bit lines 98 in the first memory die 1000, a first word line decoder circuitry that decodes the addresses for the first electrically conductive layers 46, a bit line decoder circuitry that decodes the addresses for the bit lines 98, a sense amplifier circuitry that senses the states of memory elements within the first memory stack structures 55 in the first memory die 1000 and the states of memory elements within second memory stack structures in a second memory die to be subsequently provided, a power supply/distribution circuitry that provides power to the first memory die 1000, a data buffer and/or latch, and any other semiconductor circuitry that can be used to operate the array of first memory stack structures 58 in the first memory die 1000. In addition, the logic die 700 includes a second peripheral circuitry for a second memory die to be subsequently bonded to the logic die 700 via the first memory die 1000. The second peripheral circuitry can include a second word line driver that drives the second electrically conductive layers within a second memory die, a second word line decoder circuitry that decodes the addresses for the first electrically conductive layers 46, a power supply/distribution circuitry that provides power to the second memory die, an additional data buffer and/or latch, and any other semiconductor circuitry that can be used to operate an array of second memory stack structures in the second memory die.

The logic die 700 can include a logic-die substrate 708, which can be a semiconductor substrate. The logic-die substrate can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 can be formed in an upper portion of the substrate semiconductor layer 709 to provide electrical isolation among semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the first memory die 1000, which are embodied as the first electrically conductive layers 46.

Dielectric material layers are formed over the semiconductor devices 710, which are herein referred to as logic-chip dielectric layers 760. Optionally, a dielectric liner 762 (such as a silicon nitride liner) can be formed to apply mechanical stress to the various field effect transistors and/or to prevent diffusion of hydrogen or impurities from the logic-chip dielectric layers 760 into the semiconductor devices 710. Logic-chip metal interconnect structures 780 are included within the logic-chip dielectric layers 760. The logic-chip metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and metallic pad structures 788 that are configured to function as bonding pads.

The logic die 700 can include a backside insulating layer 714 located on the backside surface of the logic die substrate 708. Laterally-insulated through-substrate via structures (711, 712) can be formed through the logic die substrate 708 to provide electrical contact to various input nodes and output nodes of the first and second periphery circuitries. Each laterally-insulated through-substrate via structure (711, 712) includes a through-substrate conductive via structure 712 and a tubular insulating liner 711 that laterally surrounds the through-substrate conductive via structure 712. Logic-side external bonding pads 716 can be formed on surface portions of the laterally-insulated through-substrate via structures (711, 712).

Figure 17:
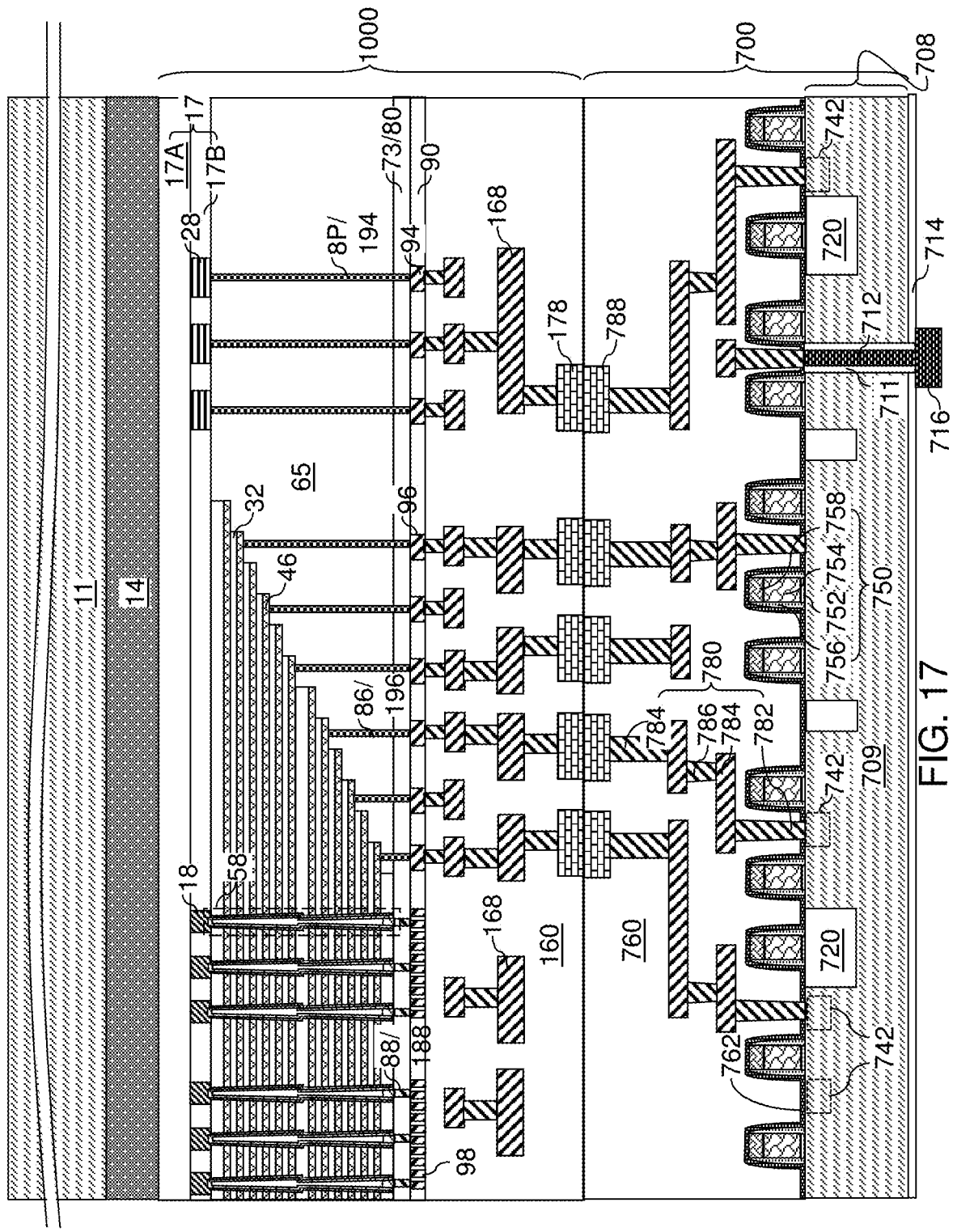
FIG. 17 is a schematic vertical cross-sectional view of the exemplary structure after bonding the logic die to a first memory die according to an embodiment of the present disclosure.

Referring to FIG. 17, the first memory die 1000 and the logic die 700 are positioned such that the metallic pad structures 788 of the logic die 700 face metallic pad structures 178 of the first memory die 1000. In one embodiment, the first memory die 1000 and the logic die 700 can be designed such that the pattern of the metallic pad structures 788 of the logic die 700 is the mirror pattern of the pattern of the metallic pad structures 178 of the first memory die 1000. The first memory die 1000 and the logic die 700 can be bonded to each other by metal-to-metal bonding. Alternatively, an array of solder material portions may be used to bond the first memory die 1000 and the logic die 700 through the array of solder material portions (such as solder balls).

In the case of metal-to-metal bonding, facing pairs of a metallic pad structure 178 of the first memory die 1000 and a metallic pad structure 788 of the logic die 700 can be brought into direct contact with each other, and can be subjected to an elevated temperature to induce material diffusion across the interfaces between adjoined pairs of metallic pad structures (178, 788). The interdiffusion of the metallic material can induce bonding between each adjoined pairs of metallic pad structures (178, 788). In addition, the logic-chip dielectric layers 760 and the interconnect level dielectric layers 160 can include a dielectric material (such as a silicate glass material) that can be bonded to each other. In this case, physically exposed surfaces of the logic-chip dielectric layers 760 and the interconnect level dielectric layers 160 can be brought into direct contact with each other and can be subjected to thermal annealing to provide additional bonding.

In the case that an array of solder material portions is used to provide bonding between the first memory die 1000 and the logic die 700, a solder material portion (such as a solder ball) can be applied to each of the metallic pad structures 178 of the first memory die 1000, and/or to each of the metallic pad structures 788 of the logic die 700. The first memory die 1000 and the logic die 700 can be bonded to each other through an array of solder material portions by reflowing the solder material portions while each solder material portion is contacted by a respective pair of a metallic pad structure 178 of the first memory die 1000 and a metallic pad structure 788 of the logic die 700.

Generally, a logic die 700 can be bonded to a first side of a first memory die 1000. The first memory die 1000 comprises an array of first memory stack structures 55, and the logic die 1000 comprises a complementary metal oxide semiconductor (CMOS) circuit that includes a first peripheral circuitry electrically coupled to nodes of the array of first memory stack structures 55 through a first subset of first metal interconnect structures 168 included within the first memory die 1000. The first memory die 1000 is formed on the sacrificial separation material layer 14. The sacrificial separation material layer 14 and the carrier substrate 11 are bonded to the logic die 700 through the first memory die 1000 upon bonding of the first memory die 1000 to the logic die 700.

Figure 18:
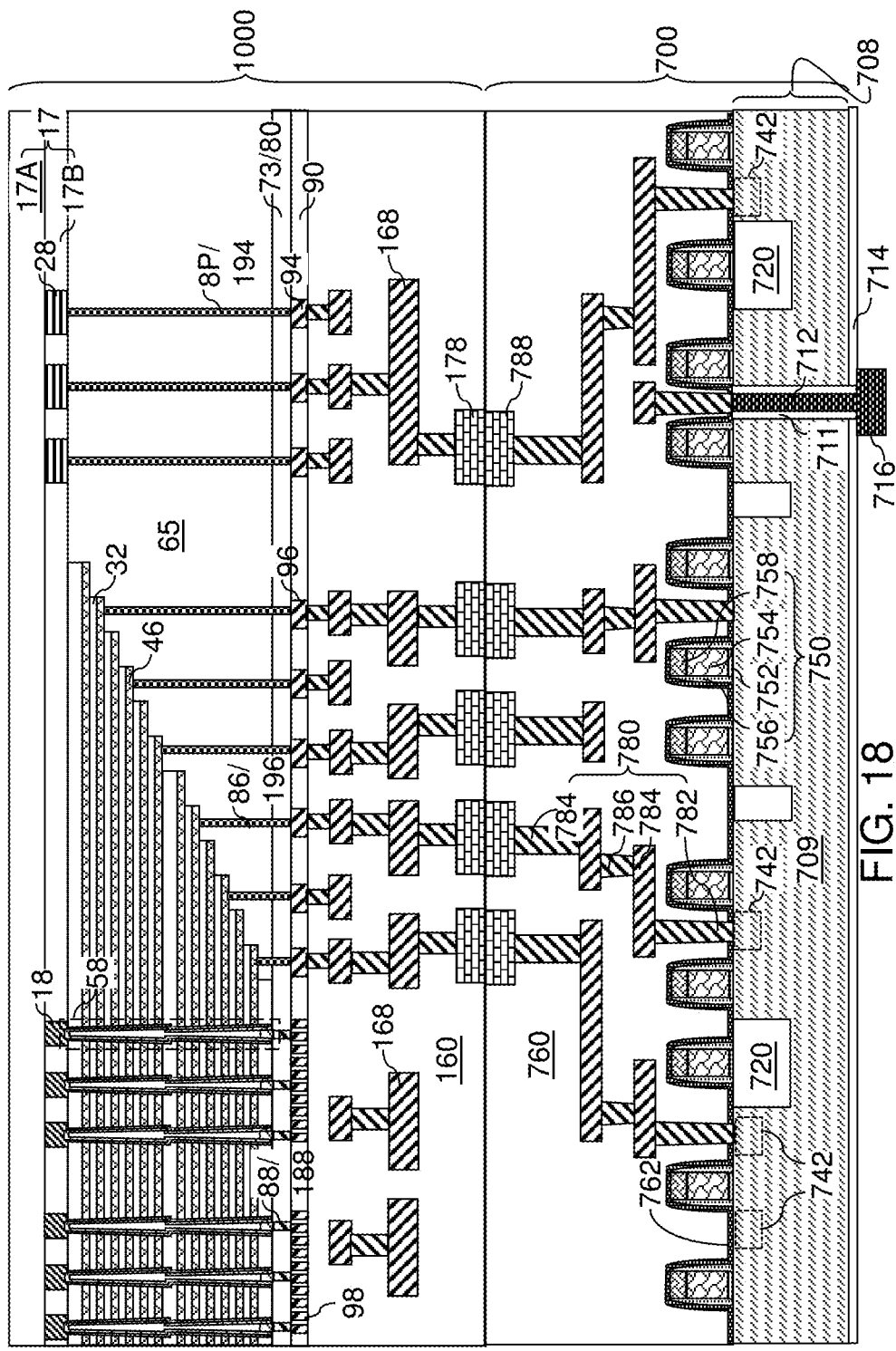
FIG. 18 is a schematic vertical cross-sectional view of the exemplary structure after removal of the sacrificial separation material layer according to an embodiment of the present disclosure.

Referring to FIG. 18, the sacrificial separation material layer 14 can be removed selective to the first memory die 1000. The carrier substrate 11 is separated from the first memory die 1000 upon removal of the sacrificial separation material layer 14. In one embodiment, the sacrificial separation material layer 14 can include silicon nitride, and removal of the sacrificial separation material layer 14 can be performed by a wet etch process using hot phosphoric acid. A backside surface of the dielectric matrix layer can be physically exposed after removal of the sacrificial separation layer 14.

Figure 19:
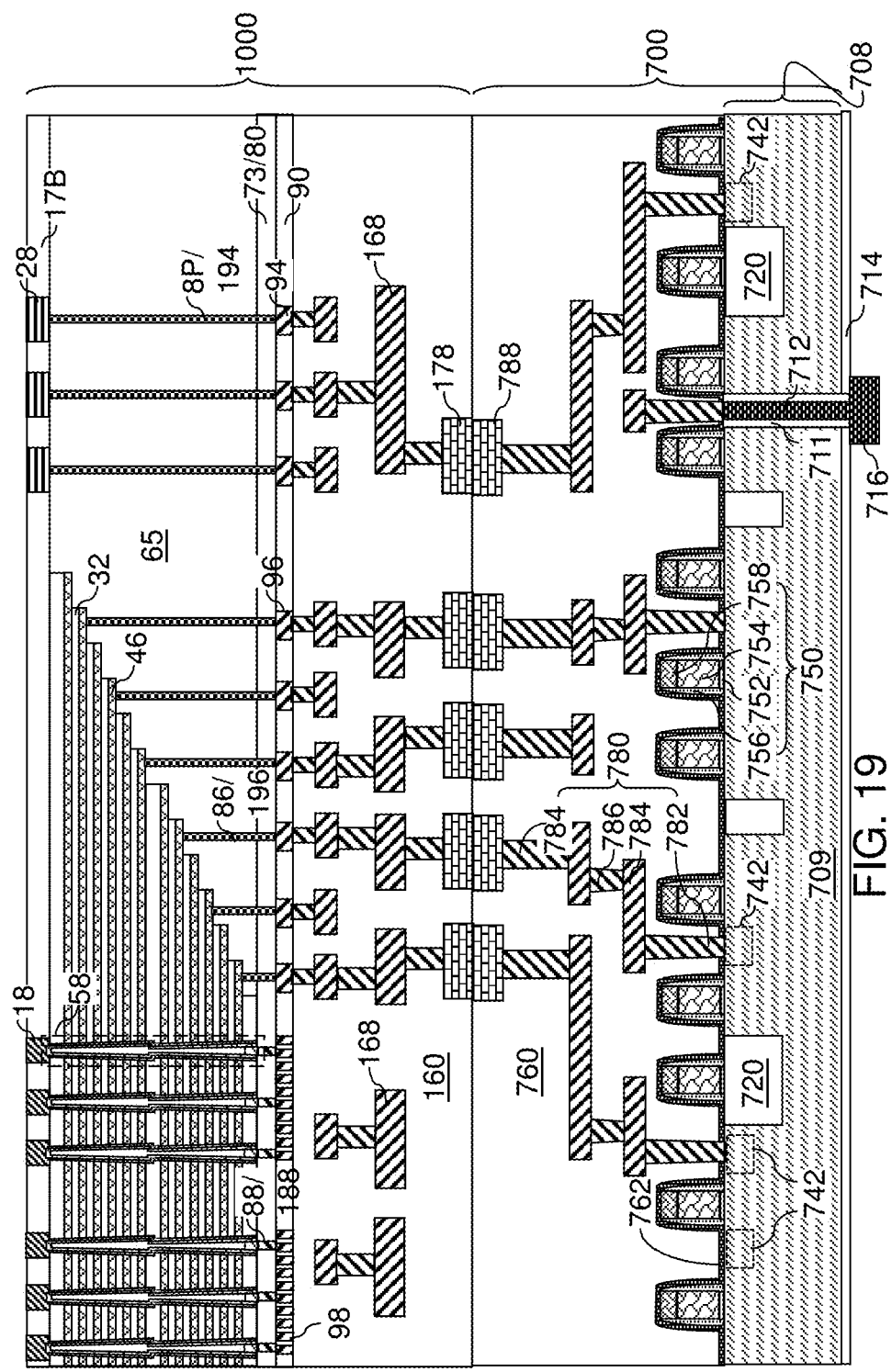
FIG. 19 is a schematic vertical cross-sectional view of the exemplary structure after physical exposure of the first distal bonding pads according to an embodiment of the present disclosure.

Referring to FIG. 19, the planar dielectric matrix layer 17A within the dielectric matrix layer 17 can be removed by a recess etch, which can include a wet etch process or a dry etch process. Removal of the planar dielectric matrix layer 17 can be selective to the first distal bonding pads (18, 28). The first distal bonding pads (18, 28) can include first distal memory-region bonding pads 18 formed in the memory array region and first distal interconnection-region bonding pads 28 formed in the interconnection region of the first memory die 1000. A backside surface of the patterned dielectric matrix layer 17B can be physically exposed upon removal of the planar dielectric matrix layer 17A.

Figure 20:
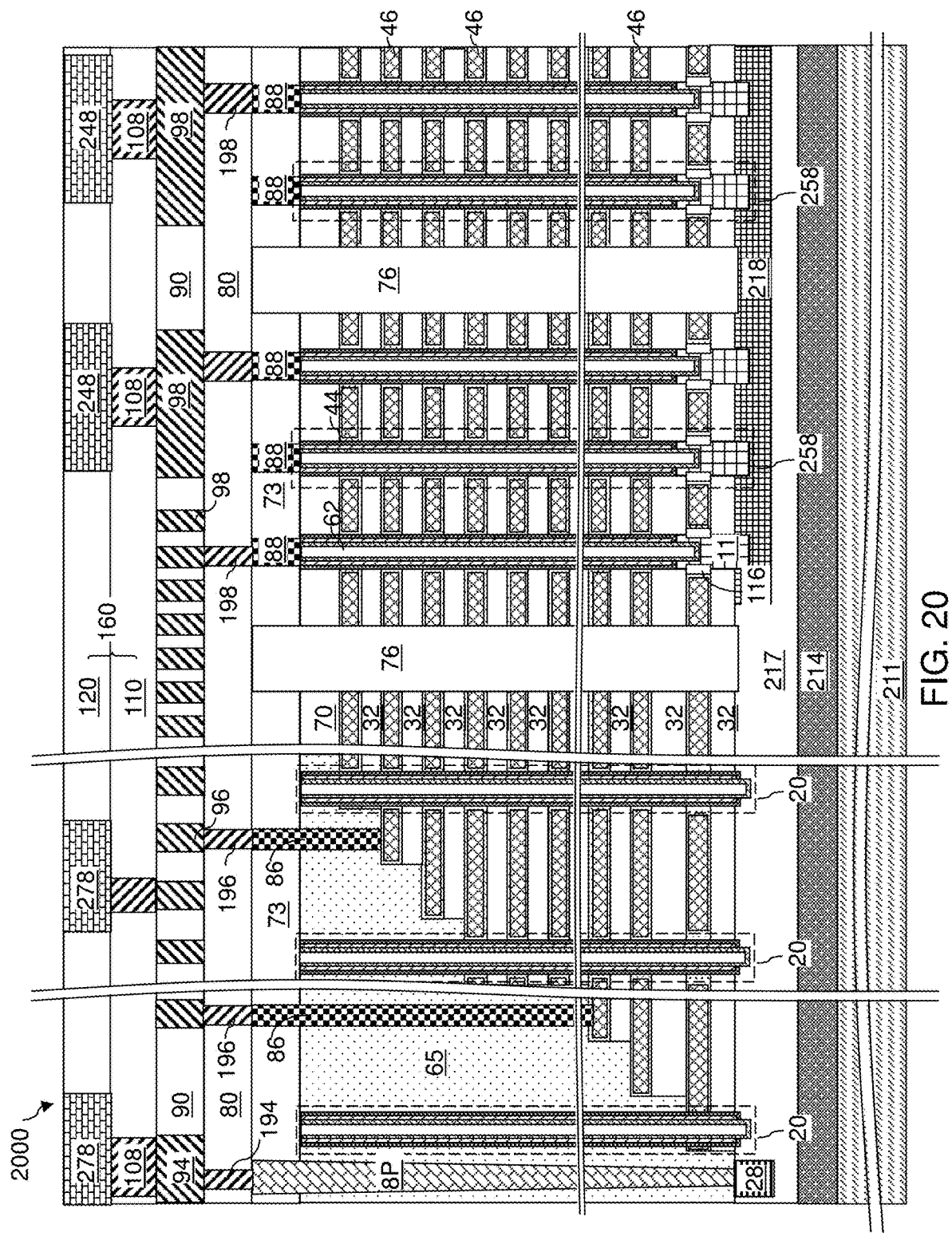
FIG. 20 is a vertical cross-sectional view of a second memory die according to an embodiment of the present disclosure.

Referring to FIG. 20, a second carrier substrate 211 is provided, which is used to provide mechanical support to a second memory die 2000 to be subsequently formed thereupon. The second carrier substrate 211 can include a semiconductor substrate such as a silicon wafer, an insulating substrate, or a conductive substrate. A second sacrificial separation material layer 214 can be formed on a front-side surface of the second carrier substrate 211. The second sacrificial material layer 214 includes a material that can be subsequently removed selective to the material of the second carrier substrate 211. For example, the second carrier substrate 211 can include a silicon wafer, and the second sacrificial material layer 214 can include a silicon nitride layer that can be deposited on the front-side surface of the second carrier substrate 211, for example, by chemical vapor deposition. The thickness of the second sacrificial material layer 214 can be in a range from 50 nm to 500 nm, although lesser and greater thicknesses can also be used.

A second dielectric matrix layer 217 can be formed over the second sacrificial separation material layer 214. The second dielectric matrix layer 217 includes a dielectric material such as silicon oxide. A source layer 218 including a doped semiconductor material having a doping of the second conductivity type can be formed on the front side of the second dielectric matrix layer 217. In one embodiment, the source layer 218 may be included within a front-side portion of the second dielectric matrix layer 217.

The processing steps of FIGS. 2-15 can be sequentially performed with modifications to form a second memory die 2000 on the top surface of the second sacrificial separation material layer 214. Modification to some processing steps may be made as needed. For example, memory opening fill structures in the second memory die 2000 can be formed with a pedestal channel portion 11 and without a drain region 63. The memory opening fill structures in the second memory die 2000 are herein referred to as second memory opening fill structures 258. An exemplary processing sequence for forming a second memory opening fill structure 258 is illustrated in FIGS. 21A-21E.

Referring to FIG. 21A, memory openings 49 and support opening are formed through an alternating stack of insulating layers 32 and sacrificial material layers 42 over the source layer 218 in the same manner as described above. The insulating layers 32 are herein referred to as second insulating layers 32, the sacrificial material layers 42 are herein referred to as second sacrificial material layers 42, and the alternating stack (32, 42) is herein referred to as a second alternating stack (32, 42).

Referring to FIG. 21B, an optional pedestal channel portion 11 can be formed at the bottom portion of each memory opening 49, for example, by a selective semiconductor deposition process. Each pedestal channel portion 11 comprises a polycrystalline semiconductor material having a doping of the first conductivity type, which is the opposite of the conductivity type of the source layer 218. In one embodiment, the top surface of each pedestal channel portion 11 can be formed above a horizontal plane including the top surface of a bottommost sacrificial material layer 42. A memory cavity 49' is present in the unfilled portion of the memory opening 49 above the pedestal channel portion 11. In one embodiment, the pedestal channel portion 11 can comprise single crystalline silicon.

Referring to FIG. 21C, a stack of layers including a blocking dielectric layer 52, a charge storage layer 54, a tunneling dielectric layer 56, and an optional first semiconductor channel layer 601 can be sequentially deposited in the memory openings 49 in the same manner as described above.

Referring to FIG. 21D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region. A surface of the pedestal channel portion 11 can be physically exposed underneath the opening through the first semiconductor channel layer 601, the tunneling dielectric layer 56, the charge storage layer 54, and the blocking dielectric layer 52.

Figure 21E:
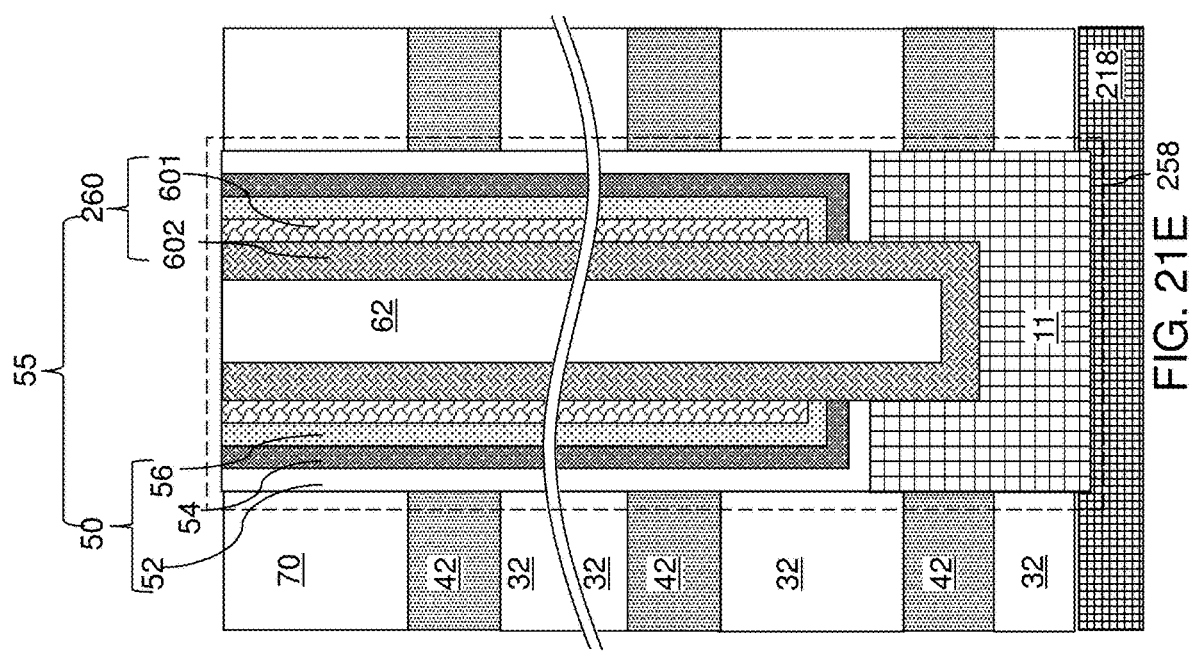

Referring to FIG. 21E, the processing steps of FIGS. 5D-5F can be performed to form a second memory opening fill structure 258 within each memory opening 49. The processing steps of FIG. 5G can be omitted. The vertical semiconductor channels in the second memory die 2000 are herein referred to as second vertical semiconductor channels 260. A combination of a memory film 50 and a second vertical semiconductor channel 260 within each second memory opening fill structure 258 constitutes a second memory stack structure 55. Thus, drain regions are not within the second memory opening fill structures 258. Support pillar structures are formed within each support opening.

In case the pedestal channel portions 11 are used, an additional processing step can be inserted between a processing step corresponding to the processing step of FIG. 9A and a processing step corresponding to the processing step of FIG. 9B. Specifically, physically exposed surface portions of the optional pedestal channel portions 11 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer. In one embodiment, each tubular dielectric spacer can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers include a dielectric material that includes the same semiconductor element as the pedestal channel portions 11 and additionally includes at least one non-metallic element such as oxygen and/or nitrogen such that the material of the tubular dielectric spacers is a dielectric material. In one embodiment, the tubular dielectric spacers can include a dielectric oxide, a dielectric nitride, or a dielectric oxynitride of the semiconductor material of the pedestal channel portions 11.

Referring back to FIG. 20, the tubular dielectric spacers 116 are expressly illustrated. Processing steps for forming additional metal interconnect structures and additional interconnect level dielectric layers 160 may be modified as needed to provide more level of electrical wiring or less levels of electrical wiring, or to modify the pattern of electrical wiring. In an illustrative example, the additional interconnect level dielectric layers 160 can include a first via level dielectric layer 110 and a second line level dielectric layer 120, and additional metal interconnect structures can include first metal via structures 108 included in the first via level dielectric layer 110, and metallic pad structures (278, 248) included in the second line level dielectric layer 120. The metallic pad structures (278, 248) are herein referred to as second proximal bonding pads (278, 248), and can include second proximal memory-region bonding pads 248 formed in a memory array region and second proximal interconnection-region bonding pads 278 that are formed in a staircase region and the interconnection region.

The second memory die 2000 includes a three-dimensional array of first memory elements. Electrical connection paths can be provided by each combination of a second proximal memory-region bonding pads 248 and a set of metal interconnect structures (198, 98, 108). Additional electrical connection paths can be provided by each combination of a second proximal interconnection-region bonding pads 278 and a set of metal interconnect structures {(194, 94, 108) or (196, 96, 108)}.

The second memory die 2000 comprises a second alternating stack of second insulating layers 32 and second electrically conductive layers 46 through which the array of second memory stack structures 258 extends. Each second memory stack structure 55 within the array of second memory stack structures 258 comprises a respective second vertical semiconductor channel 260 contacting a respective second memory film 50. The second electrically conductive layers 46 comprise word lines for the array of second memory stack structures 258.

Figure 22:
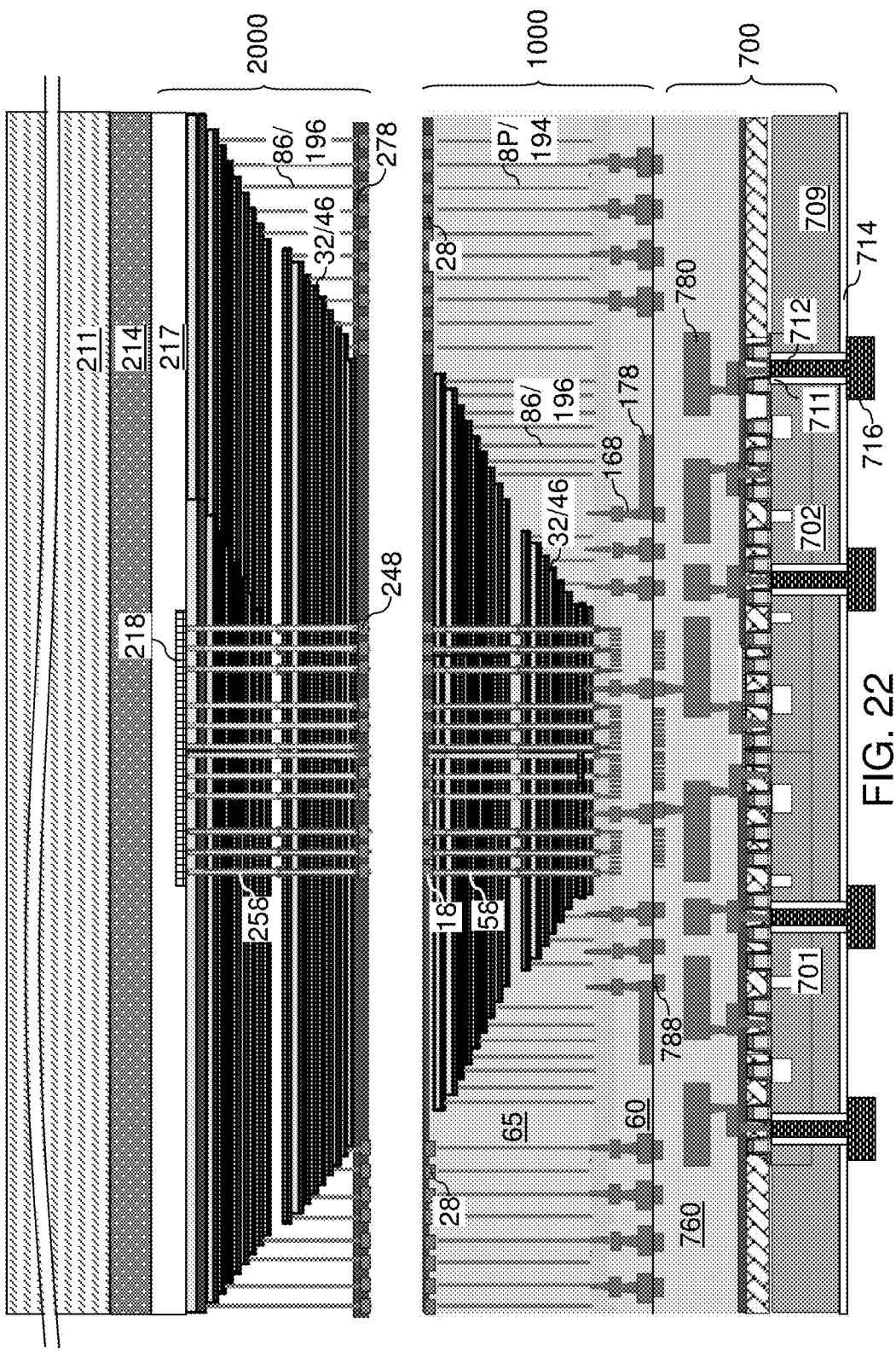
FIG. 22 is a vertical cross-sectional view of the exemplary structure after bonding the second memory die to a distal side of the first memory die according to an embodiment of the present disclosure.

Referring to FIG. 22, the second memory die 2000 can be bonded to a second side (i.e., the backside) of the first memory die 1000. A bonded assembly is provided, which includes, from one side to another, a logic die 700, a first memory die 100, and a second memory die 2000. The second memory die 2000 comprises an array of second memory stack structures 258, and the CMOS circuit of the logic die 700 includes a second peripheral circuitry electrically coupled to nodes of the array of second memory stack structures 258 through a second subset of first metal interconnect structures (168, 86, 196, 96, 94, 194, 8P) included within the first memory die 1000 and through second metal interconnect structures (88, 198, 98, 108, 86, 196, 96, 94, 194, 8P) included within the second memory die 2000. The CMOS circuit may be formed on p-doped wells 701 and n-doped wells 702 provided in the substrate semiconductor layer 709.

Portions of elements that are proximal to an interface between the logic die 700 and the first memory die 1000 are herein referred to proximal portions, and portions of elements that are distal from the interface between the logic die 700 and the first memory die 1000 are herein referred to as distal portions. In one embodiment, each of the first vertical semiconductor channels 55 has a first proximal end and a first distal end that is more distal from the logic die 700 than the first proximal end is from the logic die 700. For example, the each first proximal end of the first vertical semiconductor channels can contact a respective drain region 63, and each of the second vertical semiconductor channels 260 has a second proximal end and a second distal end that is more distal from the logic die 700 than the second proximal end is from the logic die 700. Each of the second proximal end of the second vertical semiconductor channels 260 in the second memory die 2000 is electrically connected to a first distal end of a respective one of the first vertical semiconductor channels 60 within the first memory die 1000.

Figure 23:
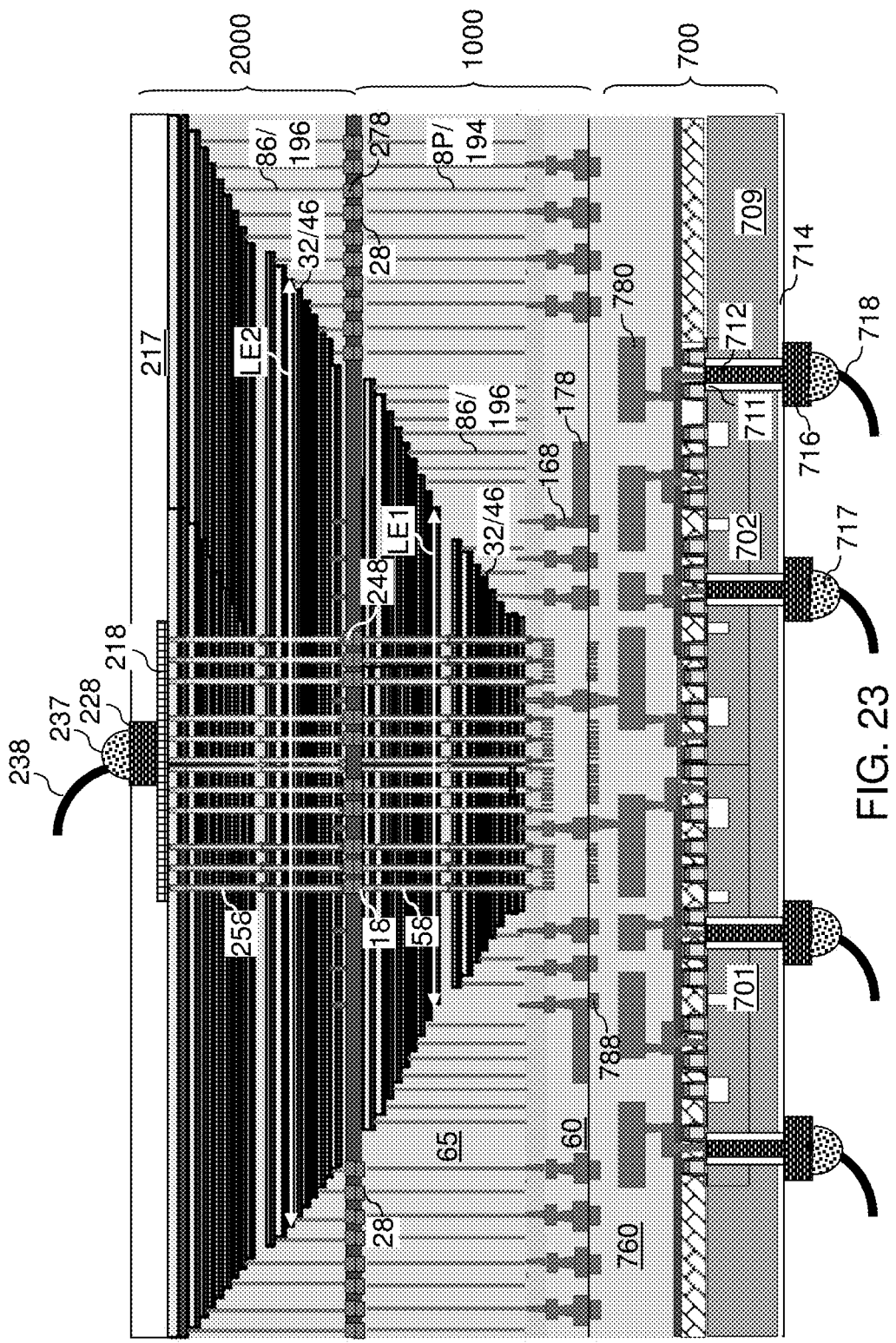
FIG. 23 is a vertical cross-sectional view of the exemplary structure after removing the sacrificial separation material layer from the second memory die according to an embodiment of the present disclosure.

Referring to FIG. 23, the second sacrificial separation material layer 214 can be removed selective to the second memory die 2000. The second carrier substrate 211 is separated from the second memory die 2000 upon removal of the second sacrificial separation material layer 214. In one embodiment, the second sacrificial separation material layer 214 can include silicon nitride, and removal of the second sacrificial separation material layer 214 can be performed by a wet etch process using hot phosphoric acid. A backside surface of the second dielectric matrix layer 217 can be physically exposed after removal of the second sacrificial separation layer 214.

At least one memory-side external bonding pad 228 can be formed over, or within, the second dielectric matrix layer 217. At least one memory-side external bonding pad 228 can include a source contact pad that is formed on the backside surface of the source layer 218. The at least one memory-side external bonding pad 228 can include additional external bonding pads formed on a backside surface of other conductive contact structures included within the second dielectric matrix layer 217. Logic-side bonding wires 718 can be bonded to the logic-side external bonding pads 716 through solder material portions 717. A memory-side bonding wire 238 can be bonded to each memory-side external bonding pad 228 through a respective solder material portion 237.

Referring to all drawings and according to various embodiments of the present disclosure, a three-dimensional memory device is provided, which comprises: a first memory die 1000 comprising an array of first memory stack structures 55; a logic die 700 bonded to a first side of the first memory die 1000, wherein the logic die 700 comprises a complementary metal oxide semiconductor (CMOS) circuit that includes a first peripheral circuitry electrically coupled to nodes of the array of first memory stack structures 55 through a first subset of first metal interconnect structures (168, 98, 198, 88, 86, 196, 96, 94, 194, 8P) included within the first memory die 1000; and a second memory die 2000 that comprises an array of second memory stack structures 55 and that is bonded to a second side of the first memory die 1000, wherein the CMOS circuit of the logic die 700 includes a second peripheral circuitry electrically coupled to nodes of the array of second memory stack structures 55 through a second subset of first metal interconnect structures (168, 98, 198, 88, 86, 196, 96, 94, 194, 8P) included within the first memory die 1000 and through second metal interconnect structures (108, 98, 198, 88, 86, 196, 96, 94, 194, 8P) included within the second memory die 2000.

In one embodiment, each first memory stack structure 55 within the array of first memory stack structures 55 comprises a respective first vertical semiconductor channel 60 contacting a respective first memory film 50; and each second memory stack structure 55 within the array of second memory stack structures 55 comprises a respective second vertical semiconductor channel 260 contacting a respective second memory film 50.

In one embodiment, the first memory die 1000 comprises a first alternating stack of first insulating layers 32 and first electrically conductive layers 46 through which the array of first memory stack structures 55 extends; and the second memory die 2000 comprises a second alternating stack of second insulating layers 32 and second electrically conductive layers 46 through which the array of second memory stack structures 55 extends.

In one embodiment, the first alternating stack (32, 46) comprises first stepped surfaces at which the first electrically conductive layers 46 have a respective first variable lateral extent that increases with a distance of a respective first electrically conductive layer 46 from the logic die 700; and the second alternating stack comprises second stepped surfaces at which the second electrically conductive layers 46 have a respective second variable lateral extent that increases with a distance of a respective second electrically conductive layer 46 from the logic die 700.

In one embodiment, a minimum of the second variable lateral extents of all of the second electrically conductive layers 46 is the same as, or is greater than, a maximum of the first variable lateral extents of all of the first electrically conductive layers 46.

In one embodiment, the first electrically conductive layers 46 comprise word lines for the array of first memory stack structures 55; and the second electrically conductive layers 46 comprise word lines for the array of second memory stack structures 55.

In one embodiment, the first subset of first metal interconnect structures (168, 98, 198, 88, 86, 196, 96, 94, 194, 8P) comprises first word line contact via structures 86 that contact a respective one of the first electrically conductive layers 46 and are electrically connected to a respective node within the logic die 700 through a respective pair of first bonding pads (178, 788) located at an interface between the logic die 700 and the first memory die 1000; and the second metal interconnect structures (108, 98, 198, 88, 86, 196, 96, 94, 194, 8P) comprises second word line contact via structures 86 contacting a respective one of the second electrically conductive layers 46 and electrically connected to a respective node of the logic die 700 through a respective pair of second bonding pads (28, 278) located at an interface between the first memory die 1000 and the second memory die 2000, a respective pair of third bonding pads (178, 788) located at the interface between the logic die 700 and the first memory die 1000, and a respective one of pass-through via structures 8P included within the first memory die 1000 and electrically connecting the second bonding pads (28, 278) and the third bonding pads (178, 788).

In one embodiment, the array of first memory stack structures 55 comprises a two-dimensional array of first NAND strings that vertically extend through the first alternating stack (32, 46); and the array of second memory stack structures 55 comprises a two-dimensional array of second NAND strings that vertically extend through the second alternating stack (32, 46).

In one embodiment, each of the first vertical semiconductor channels 60 has a first proximal end and a first distal end that is more distal from the logic die 700 than the first proximal end is from the logic die 700; each of the second vertical semiconductor channels 260 has a second proximal end and a second distal end that is more distal from the logic die 700 than the second proximal end is from the logic die 700; and each of the second proximal end of the second vertical semiconductor channels 260 is electrically connected to a first distal end of a respective one of the first vertical semiconductor channels 60.

Pairs of bonding pads {(18, 248), (28, 278)} can be located at an interface between the first memory die 1000 and the second memory die 2000, and can provide electrical connections between a first distal end of a respective one of the first vertical semiconductor channels 60 and a second proximal end of a respective one of the second vertical semiconductor channels 260.

A source layer 218 can be located in the second memory die 2000. The source layer 218 is more distal from the logic die 700 than the second alternating stack (32, 46) is from the logic die 700, and is electrically connected to the second distal ends of the second vertical semiconductor channels 260.

In one embodiment, the bonded assembly can comprise: a source contact pad 228 that is located on the source layer 218 and is bonded to a memory-side bonding wire 238; laterally-insulated through-substrate via structures (711, 712) extending through a substrate (i.e., a logic-die substrate 708) of the logic die 700 and electrically connected nodes of the CMOS circuit; and logic-side bonding pads 716 contacting the laterally-insulated through-substrate via structures (711, 712) and located on a distal side of the substrate (i.e., the logic-die substrate 708).

Various embodiments of the present disclosure provide three-dimensional memory devices and methods of making the same that enable incorporating a greater number of word lines and a high-performance support circuitry than in conventional three-dimensional memory device structures, thereby improving memory device performance while reducing the size of the devices and manufacturing costs.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device, comprising:
    a first memory die comprising an array of first memory stack structures;
    a logic die bonded to a first side of the first memory die, wherein the logic die comprises a complementary metal oxide semiconductor (CMOS) circuit that includes a first peripheral circuitry electrically coupled to nodes of the array of first memory stack structures through a first subset of first metal interconnect structures included within the first memory die;
    a second memory die that comprises an array of second memory stack structures and that is bonded to a second side of the first memory die, wherein the CMOS circuit of the logic die includes a second peripheral circuitry electrically coupled to nodes of the array of second memory stack structures through a second subset of first metal interconnect structures included within the first memory die and through second metal interconnect structures included within the second memory die,
    wherein:
        each first memory stack structure within the array of first memory stack structures comprises a respective first vertical semiconductor channel contacting a respective first memory film;
        each second memory stack structure within the array of second memory stack structures comprises a respective second vertical semiconductor channel contacting a respective second memory film;
        the first memory die comprises a first alternating stack of first insulating layers and first electrically conductive layers through which the array of first memory stack structures extends;
        the second memory die comprises a second alternating stack of second insulating layers and second electrically conductive layers through which the array of second memory stack structures extends;
        the first electrically conductive layers comprise word lines for the array of first memory stack structures; and
        the second electrically conductive layers comprise word lines for the array of second memory stack structures; and
    at least one feature selected from:
        a first feature wherein:
            the first subset of first metal interconnect structures comprises first word line contact via structures that contact a respective one of the first electrically conductive layers and that are electrically connected to a respective node within the logic die through a respective pair of first bonding pads located at an interface between the logic die and the first memory die; and
            the second metal interconnect structures comprises second word line contact via structures that contact a respective one of the second electrically conductive layers and that are electrically connected to a respective node of the logic die through a respective pair of second bonding pads located at an interface between the first memory die and the second memory die, a respective pair of third bonding pads located at the interface between the logic die and the first memory die, and a respective one of pass-through via structures included within the first memory die and electrically connecting the second bonding pads and the third bonding pads; or a second feature wherein:
the array of first memory stack structures comprises a two-dimensional array of first NAND strings that vertically extend through the first alternating stack;
the array of second memory stack structures comprises a two-dimensional array of second NAND strings that vertically extend through the second alternating stack;
each of the first vertical semiconductor channels has a first proximal end and a first distal end that is more distal from the logic die than the first proximal end is from the logic die;
each of the second vertical semiconductor channels has a second proximal end and a second distal end that is more distal from the logic die than the second proximal end is from the logic die;
each of the second proximal end of the second vertical semiconductor channels is electrically connected to a first distal end of a respective one of the first vertical semiconductor channels; and
the three-dimensional memory device further comprises pairs of bonding pads located at an interface between the first memory die and the second memory die that provide electrical connections between a first distal end of a respective one of the first vertical semiconductor channels and a second proximal end of a respective one of the second vertical semiconductor channels.

2. The three-dimensional memory device of claim 1, wherein:
the first alternating stack comprises first stepped surfaces at which the first electrically conductive layers have a respective first variable lateral extent that increases with a distance of a respective first electrically conductive layer from the logic die; and
the second alternating stack comprises second stepped surfaces at which the second electrically conductive layers have a respective second variable lateral extent that increases with a distance of a respective second electrically conductive layer from the logic die.

3. The three-dimensional memory device of claim 1, wherein the at least one feature comprises the first feature.

4. The three-dimensional memory device of claim 1, wherein the at least one feature comprises the second feature.

5. The three-dimensional memory device of claim 4, further comprising a source layer that is located in the second memory die, is more distal from the logic die than the second alternating stack is from the logic die, and is electrically connected to the second distal ends of the second vertical semiconductor channels.

6. The three-dimensional memory device of claim 5, further comprising:
a source contact pad that is located on the source layer and is bonded to a memory-side bonding wire;
laterally-insulated through-substrate via structures extending through a substrate of the logic die and electrically connected nodes of the CMOS circuit; and
logic-side bonding pads contacting the laterally-insulated through-substrate via structures and located on a distal side of the substrate.

7. A three-dimensional memory device, comprising:
a first memory die comprising an array of first memory stack structures;
a logic die bonded to a first side of the first memory die, wherein the logic die comprises a complementary metal oxide semiconductor (CMOS) circuit that includes a first peripheral circuitry electrically coupled to nodes of the array of first memory stack structures through a first subset of first metal interconnect structures included within the first memory die;
a second memory die that comprises an array of second memory stack structures and that is bonded to a second side of the first memory die, wherein the CMOS circuit of the logic die includes a second peripheral circuitry electrically coupled to nodes of the array of second memory stack structures through a second subset of first metal interconnect structures included within the first memory die and through second metal interconnect structures included within the second memory die;
wherein:
each first memory stack structure within the array of first memory stack structures comprises a respective first vertical semiconductor channel contacting a respective first memory film;
each second memory stack structure within the array of second memory stack structures comprises a respective second vertical semiconductor channel contacting a respective second memory film;
the first memory die comprises a first alternating stack of first insulating layers and first electrically conductive layers through which the array of first memory stack structures extends;
the second memory die comprises a second alternating stack of second insulating layers and second electrically conductive layers through which the array of second memory stack structures extends;
the first alternating stack comprises first stepped surfaces at which the first electrically conductive layers have a respective first variable lateral extent that increases with a distance of a respective first electrically conductive layer from the logic die;
the second alternating stack comprises second stepped surfaces at which the second electrically conductive layers have a respective second variable lateral extent that increases with a distance of a respective second electrically conductive layer from the logic die; and
a minimum of the second variable lateral extents of all of the second electrically conductive layers is the same as, or is greater than, a maximum of the first variable lateral extents of all of the first electrically conductive layers.

8. A method of forming a three-dimensional memory device, comprising:
providing a first memory die including an array of first memory stack structures;
bonding a first side of the first memory die to a logic die, wherein the logic die comprises a complementary metal oxide semiconductor (CMOS) circuit that includes a first peripheral circuitry electrically coupled to nodes of the array of first memory stack structures through a first subset of first metal interconnect structures included within the first memory die;
bonding a second memory die to a second side of the first memory die, wherein the second memory die comprises an array of second memory stack structures, and the CMOS circuit of the logic die includes a second peripheral circuitry electrically coupled to nodes of the array of second memory stack structures through a second subset of first metal interconnect structures included within the first memory die and through second metal interconnect structures included within the second memory die;

wherein:

each first memory stack structure within the array of first memory stack structures comprises a respective first vertical semiconductor channel contacting a respective first memory film;

each second memory stack structure within the array of second memory stack structures comprises a respective second vertical semiconductor channel contacting a respective second memory film;

the first memory die comprises a first alternating stack of first insulating layers and first electrically conductive layers through which the array of first memory stack structures extends;

the second memory die comprises a second alternating stack of second insulating layers and second electrically conductive layers through which the array of second memory stack structures extends; and at least one feature selected from:

a first feature comprising:

forming a sacrificial separation material layer over a carrier substrate;

forming the first memory die on the sacrificial separation material layer, wherein the sacrificial separation material layer and the carrier substrate are bonded to the logic die through the first memory die upon bonding of the first memory die to the logic die; and removing the sacrificial separation material layer selective to the first memory die, wherein the carrier substrate is separated from the first memory die; or a second feature wherein:

the first electrically conductive layers comprise word lines for the array of first memory stack structures;

the second electrically conductive layers comprise word lines for the array of second memory stack structures;

the first subset of first metal interconnect structures comprises first word line contact via structures that contact a respective one of the first electrically conductive layers and that are electrically connected to a respective node within the logic die through a respective pair of first bonding pads located at an interface between the logic die and the first memory die; and the second metal interconnect structures comprises second word line contact via structures that contact a respective one of the second electrically conductive layers and that are electrically connected to a respective node of the logic die through a respective pair of second bonding pads located at an interface between the first memory die and the second memory die, a respective pair of third bonding pads located at the interface between the logic die and the first memory die, and a respective one of pass-through via structures included within the first memory die and electrically connecting the second bonding pads and the third bonding pads; or a third feature wherein:

the first electrically conductive layers comprise word lines for the array of first memory stack structures;

the second electrically conductive layers comprise word lines for the array of second memory stack structures;

the array of first memory stack structures comprises a two-dimensional array of first NAND strings that vertically extend through the first alternating stack;

the array of second memory stack structures comprises a two-dimensional array of second NAND strings that vertically extend through the second alternating stack;

each of the first vertical semiconductor channels has a first proximal end and a first distal end that is more distal from the logic die than the first proximal end is from the logic die;

each of the second vertical semiconductor channels has a second proximal end and a second distal end that is more distal from the logic die than the second proximal end is from the logic die;

each of the second proximal end of the second vertical semiconductor channels is electrically connected to a first distal end of a respective one of the first vertical semiconductor channels; and pairs of bonding pads are located at an interface between the first memory die and the second memory die and provide electrical connections between a first distal end of a respective one of the first vertical semiconductor channels and a second proximal end of a respective one of the second vertical semiconductor channels.

9. The method of claim 8, wherein the at least one feature comprises the first feature.

10. The method of claim 8, wherein the at least one feature comprises the second feature.

11. The method of claim 8, wherein the at least one feature comprises the third feature.

12. The method of claim 11, wherein:

the second memory die comprises a source layer that is located in the second memory die, is more distal from the logic die than the second alternating stack is from the logic die, and is electrically connected to the second distal ends of the second vertical semiconductor channels; and the method further comprises forming a source contact pad on the source layer and bonding a memory-side bonding wire to the source contact pad.

* * * * *